(12) United States Patent
Igata et al.

(10) Patent No.: US 12,300,972 B2
(45) Date of Patent: May 13, 2025

(54) LIGHT EMITTING DEVICE

(71) Applicant: NICHIA CORPORATION, Anan (JP)

(72) Inventors: Toshiya Igata, Tokushima (JP);
Eiichiro Okahisa, Tokushima (JP);
Takeshi Imai, Anan (JP)

(73) Assignee: NICHIA CORPORATION, Anan (JP)

( * ) Notice: Subject to any disclaimer, the term of this patent is extended or adjusted under 35 U.S.C. 154(b) by 663 days.

(21) Appl. No.: 17/580,551

(22) Filed: Jan. 20, 2022

(65) Prior Publication Data

US 2022/0231484 A1 Jul. 21, 2022

(30) Foreign Application Priority Data

Jan. 21, 2021 (JP) ................. 2021-007966
Sep. 9, 2021 (JP) ................. 2021-146580
Dec. 24, 2021 (JP) ................. 2021-211725

(51) Int. Cl.
*H01S 5/40* (2006.01)

(52) U.S. Cl.
CPC .......... *H01S 5/4018* (2013.01); *H01S 5/4093* (2013.01)

(58) Field of Classification Search
None
See application file for complete search history.

(56) References Cited

U.S. PATENT DOCUMENTS

| | | |
|---|---|---|
| 2007/0013647 A1 | 1/2007 | Lee et al. |
| 2009/0021932 A1 | 1/2009 | Kim et al. |
| 2009/0168399 A1 | 7/2009 | Kim et al. |
| 2011/0026241 A1 | 2/2011 | Kim et al. |
| 2014/0313696 A1 | 10/2014 | Kim et al. |
| 2016/0062224 A1 | 3/2016 | Nagahara et al. |
| 2016/0341395 A1 | 11/2016 | Kiyota et al. |
| 2018/0182928 A1* | 6/2018 | Namie ............... H01S 5/02257 |
| 2019/0203908 A1 | 7/2019 | Kiyota et al. |
| 2021/0083451 A1 | 3/2021 | Hashimoto |

(Continued)

FOREIGN PATENT DOCUMENTS

| | | |
|---|---|---|
| CN | 106168333 A | 11/2016 |
| JP | 2004-157225 A | 6/2004 |

(Continued)

*Primary Examiner* — Tuan N Nguyen
(74) *Attorney, Agent, or Firm* — Foley & Lardner LLP

(57) ABSTRACT

A light emitting device includes: a base having a mounting face including a disposition region, a plurality of first wirings, and a plurality of second wirings; a plurality of light emitting elements, including one or more first light emitting elements, one or more second light emitting elements, and one or more third light emitting elements, disposed in two rows and N columns (N≥2) in the disposition region; one or more relay members, including one or more first relay members disposed in the region between the two rows of the light emitting elements; a plurality of first light emitting element wirings for electrically serially connecting the one or more first light emitting elements; a plurality of second light emitting element wirings for electrically serially connecting the one or more second light emitting elements; and a plurality of third light emitting element wirings for electrically serially connecting the one or more third light emitting elements. The first light emitting element wirings include wirings that are connected with the one or more first relay members.

9 Claims, 17 Drawing Sheets

(56) References Cited

U.S. PATENT DOCUMENTS

| | | |
|---|---|---|
| 2021/0180766 A1 | 6/2021 | Kiyota et al. |
| 2022/0349551 A1 | 11/2022 | Kiyota et al. |
| 2023/0243484 A1 | 8/2023 | Kiyota et al. |
| 2024/0125455 A1 | 4/2024 | Kiyota et al. |

FOREIGN PATENT DOCUMENTS

| | | |
|---|---|---|
| JP | 2007-027745 A | 2/2007 |
| JP | 2007-292919 A | 11/2007 |
| JP | 2009-026765 A | 2/2009 |
| JP | 2016-051603 A | 4/2016 |
| JP | WO2014-010161 A1 | 6/2016 |
| JP | 2018-093192 A | 6/2018 |
| JP | 2018-190750 A | 11/2018 |
| JP | 2020-074457 A | 5/2020 |
| JP | 2021-044501 A | 3/2021 |
| WO | WO-2014/010161 A1 | 1/2014 |

* cited by examiner

[FIG.1]
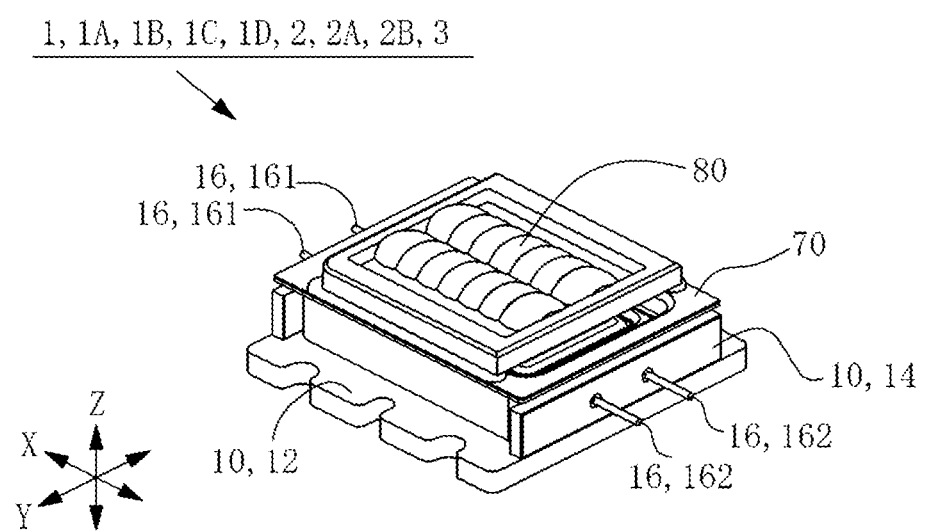

[FIG.2]
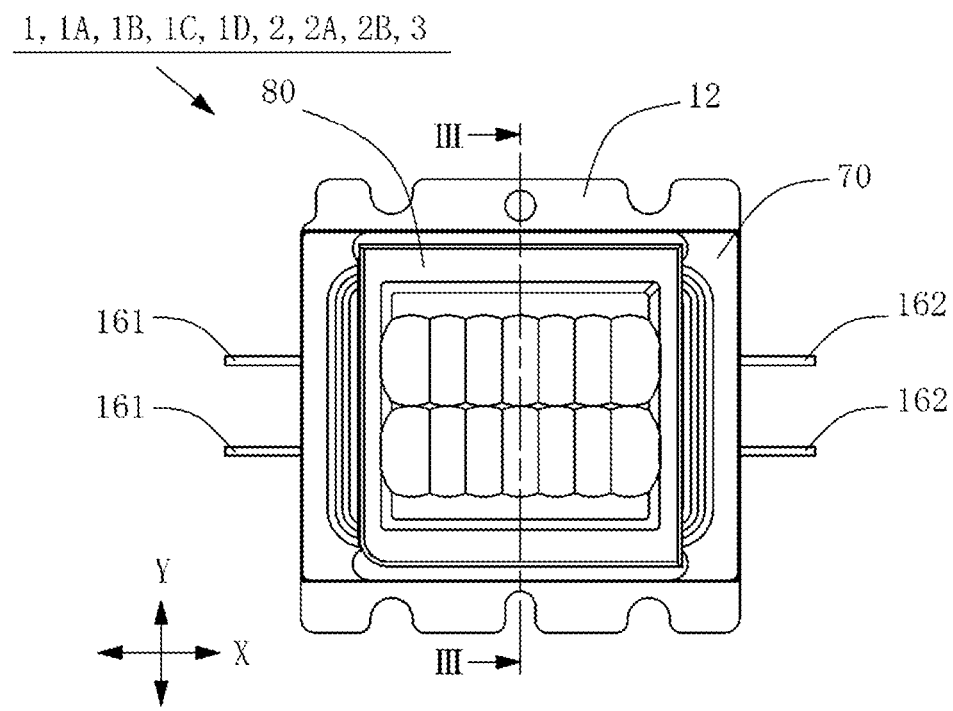
[FIG.3]
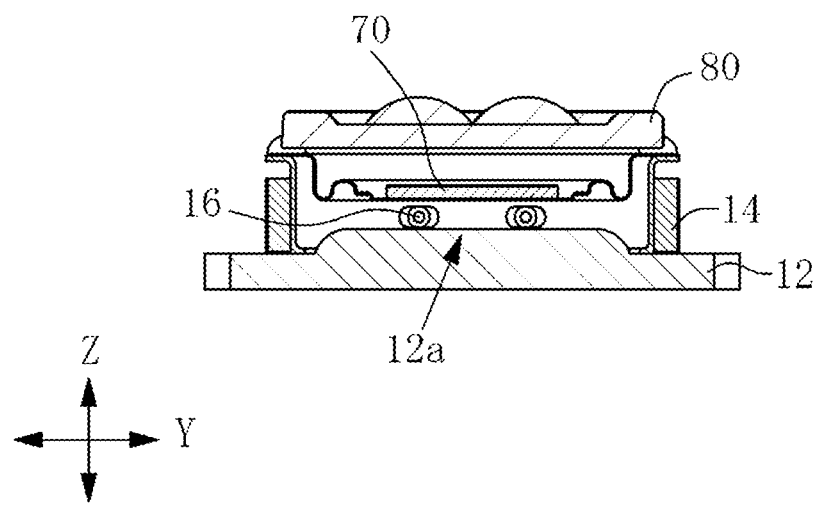

[FIG.4]
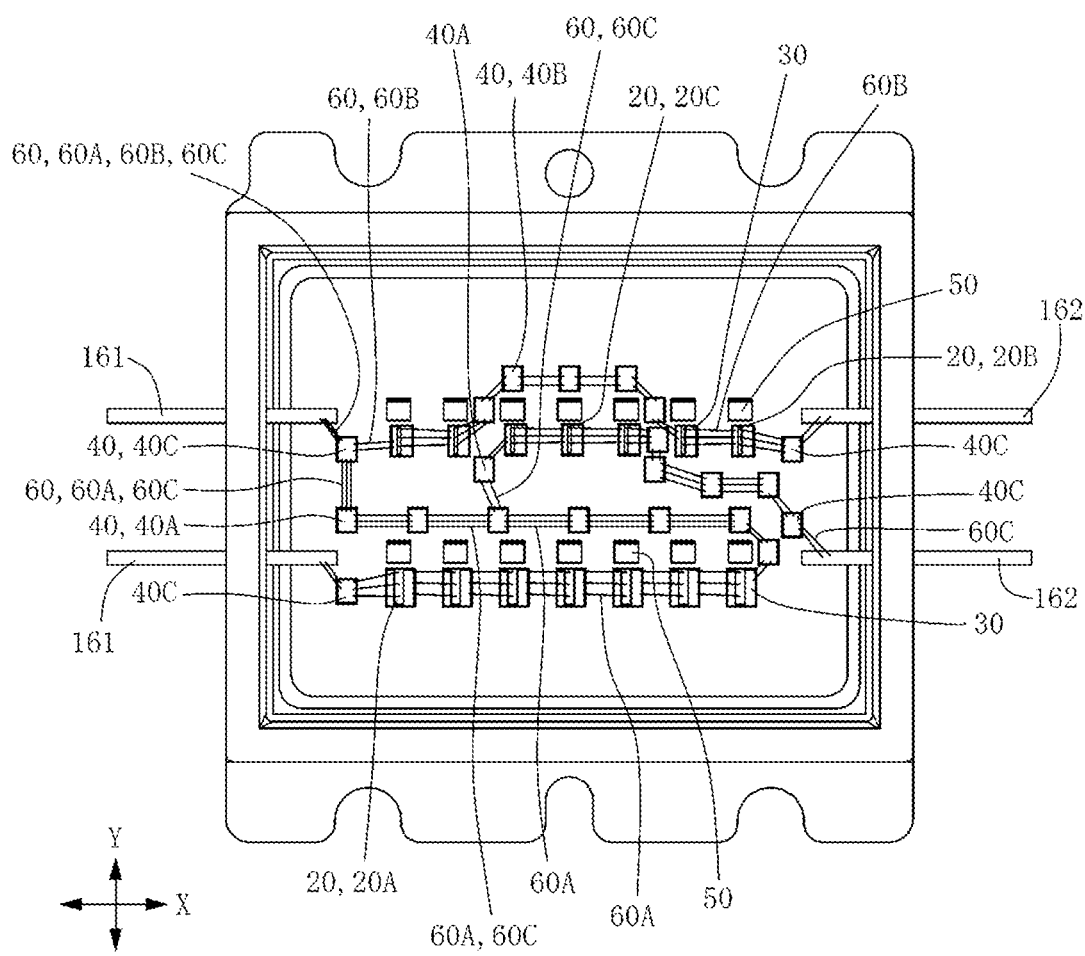

[FIG.5]
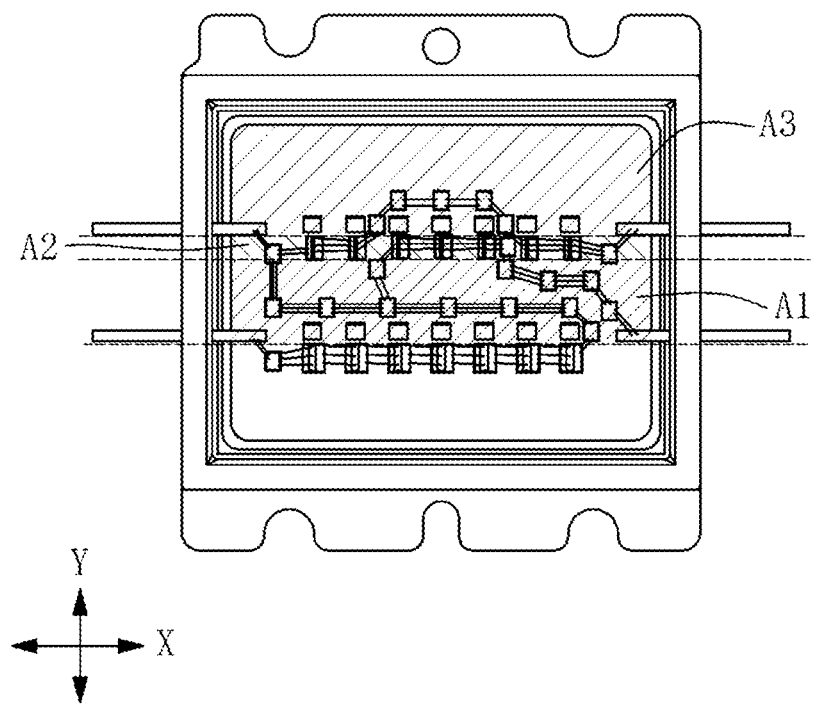

[FIG.6]
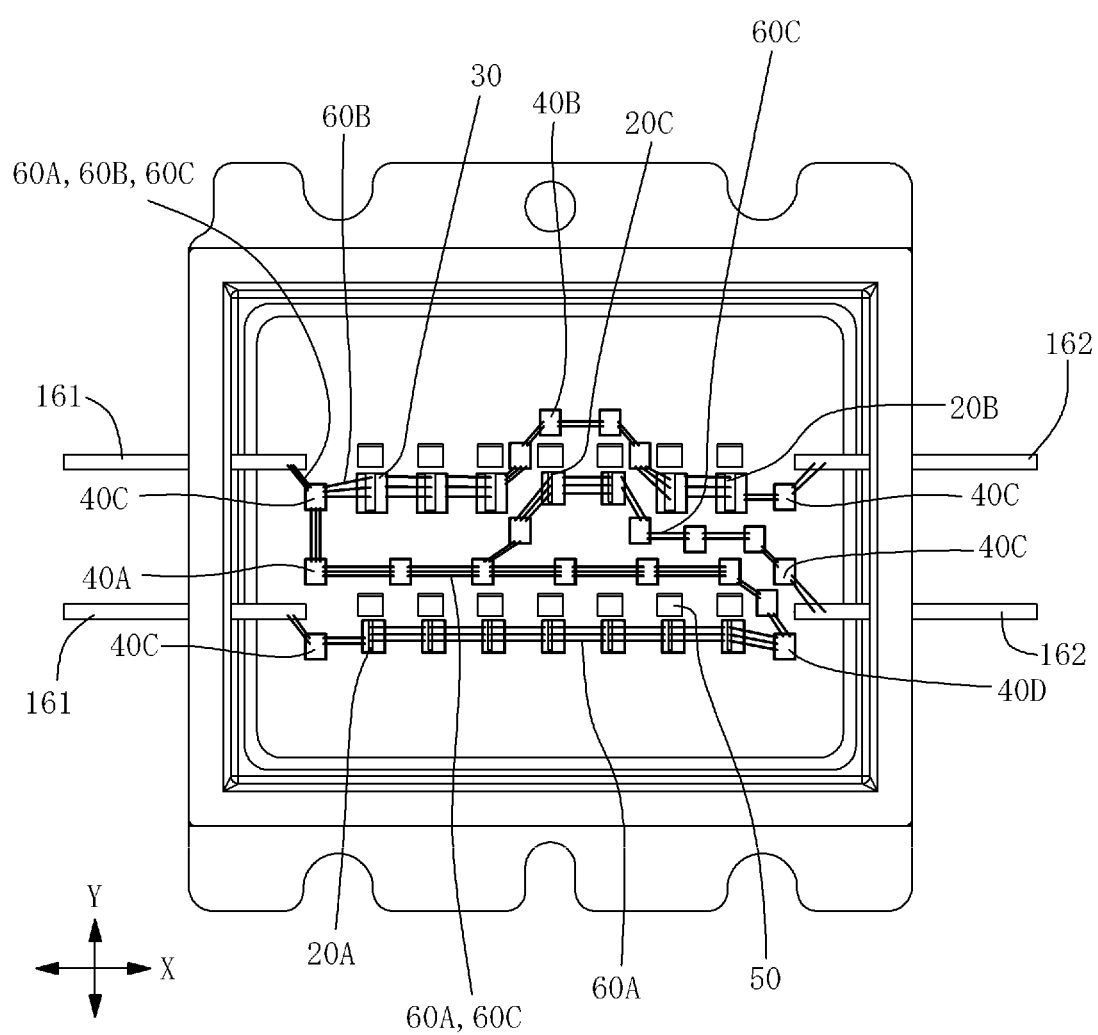

[FIG.7]
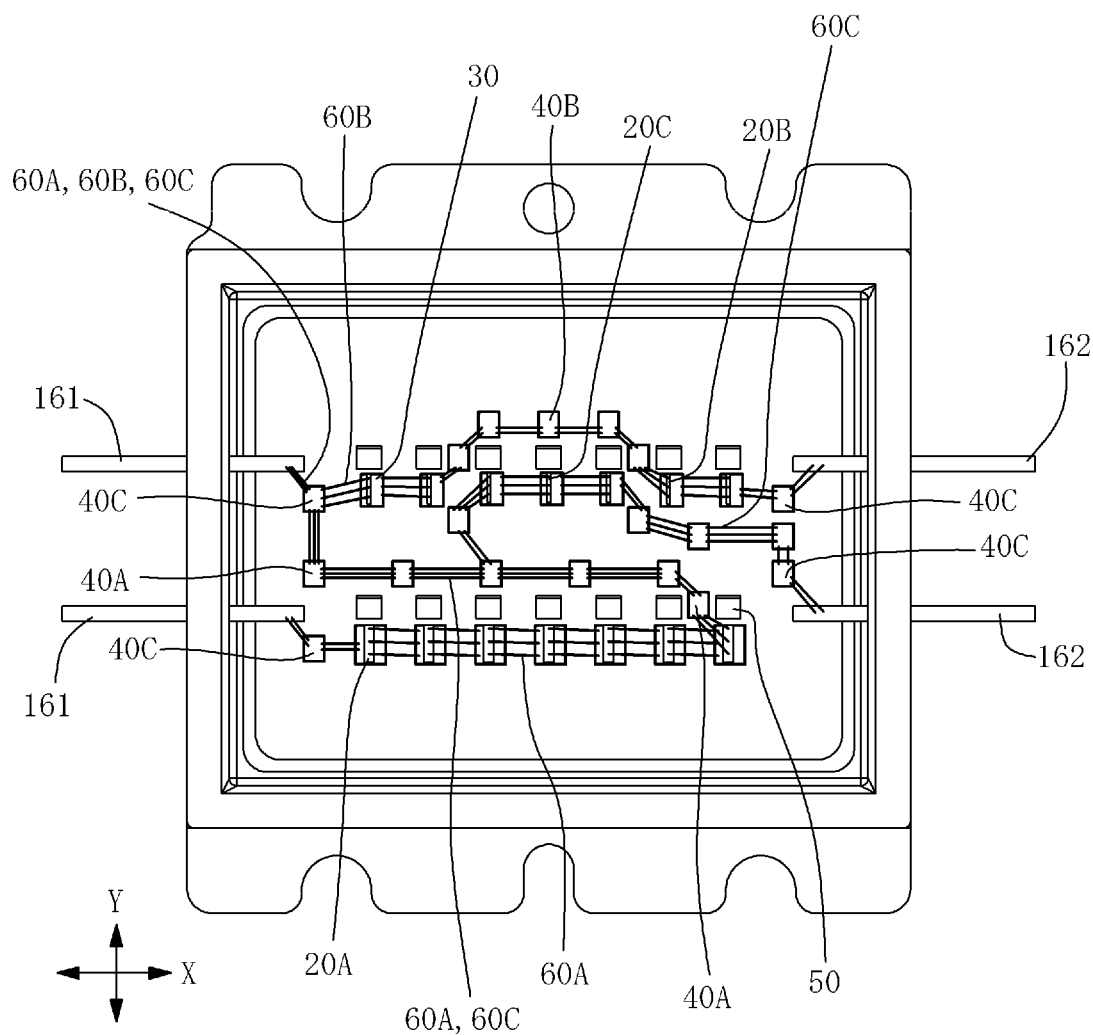

[FIG.8]
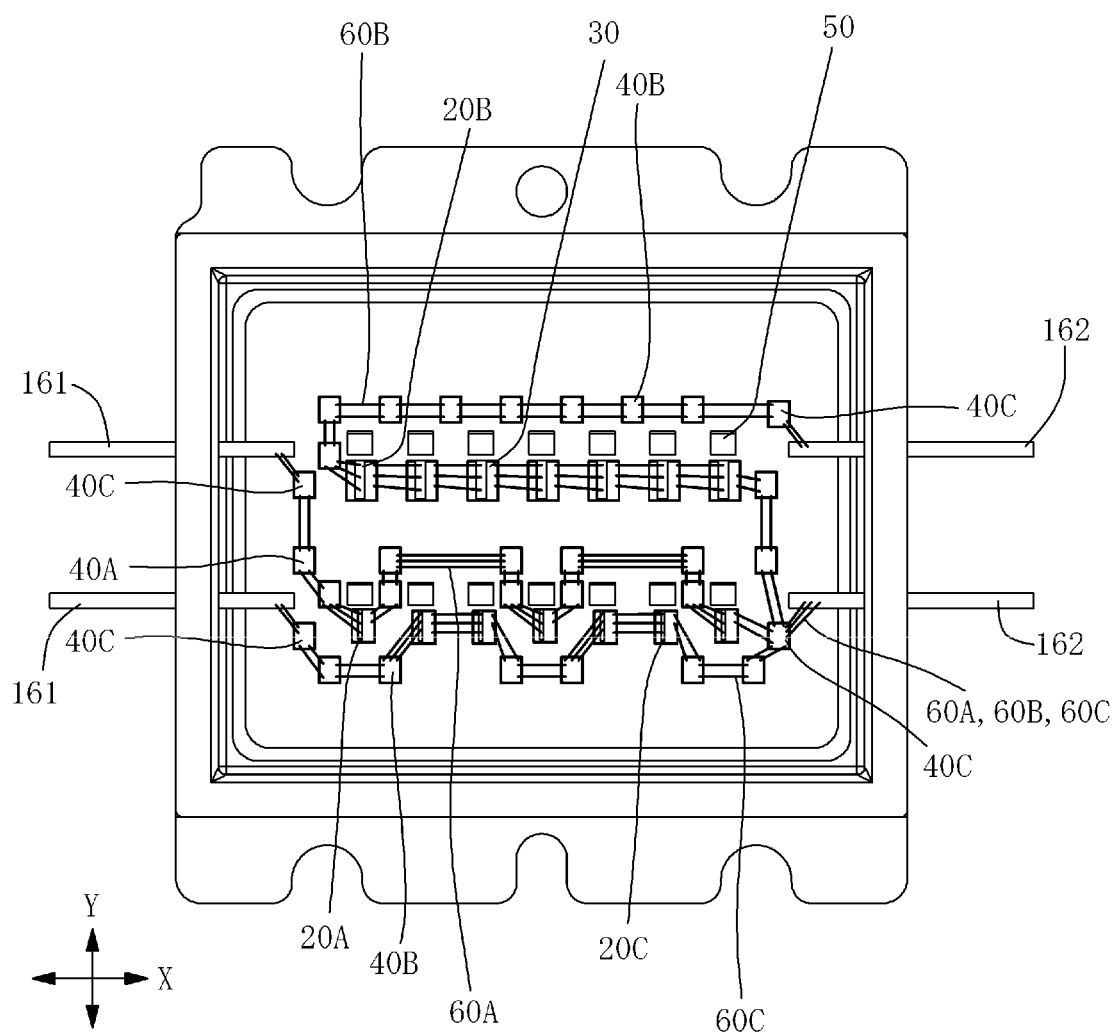

[FIG.9]
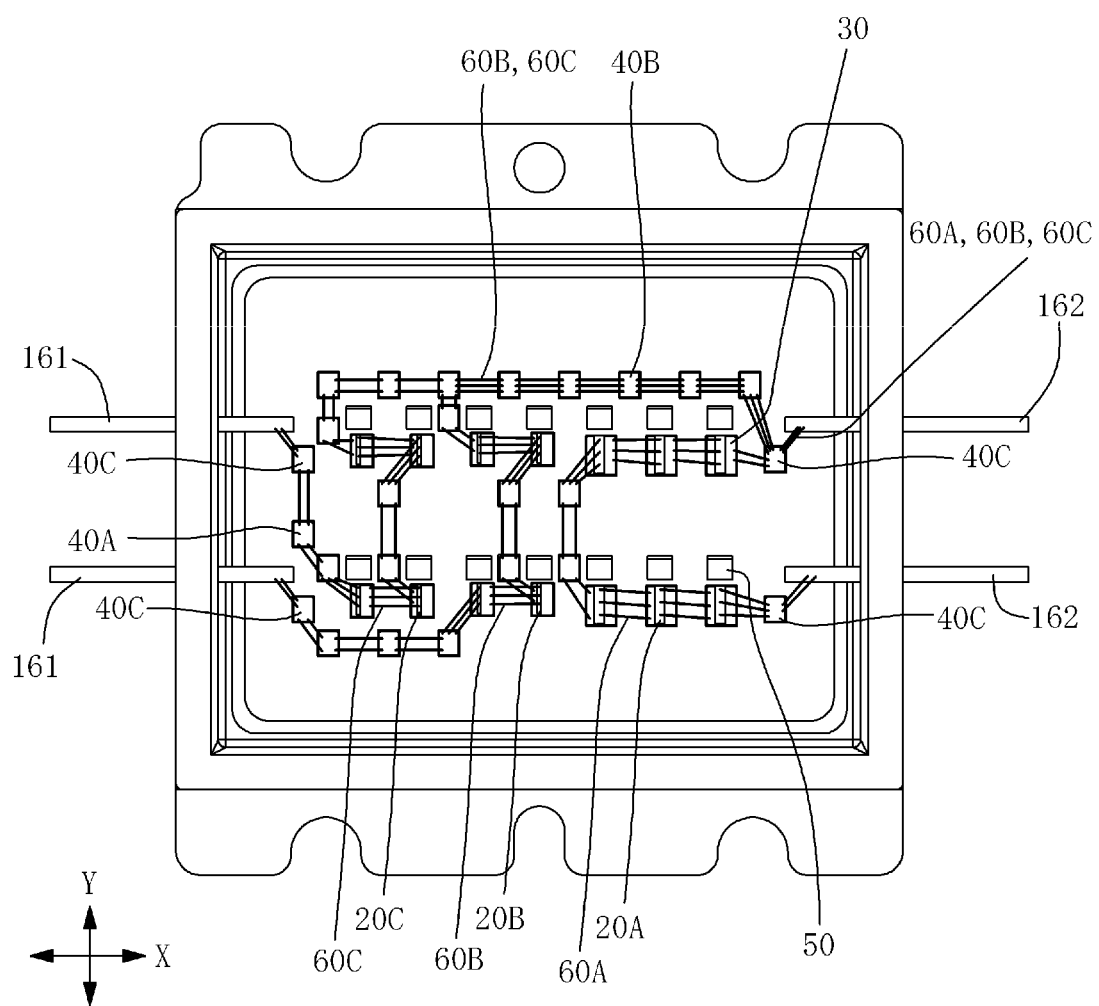

[FIG.10]
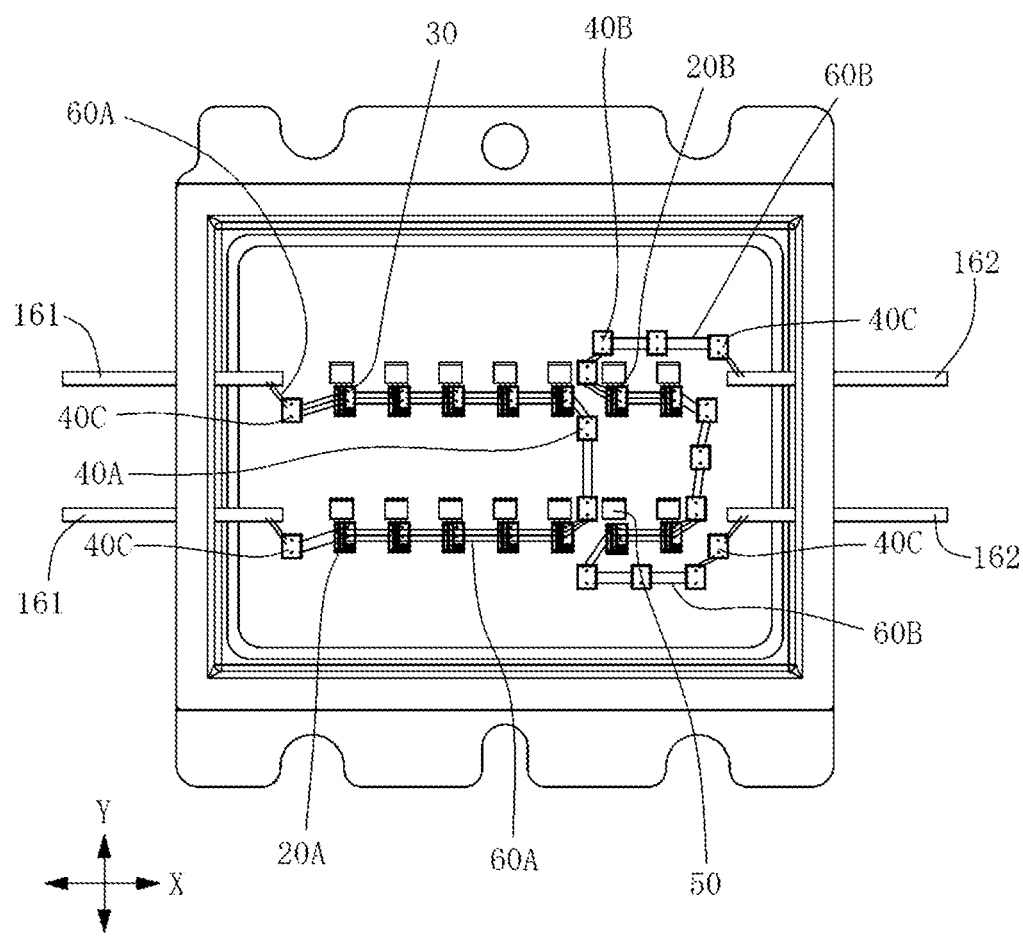

[FIG.11]
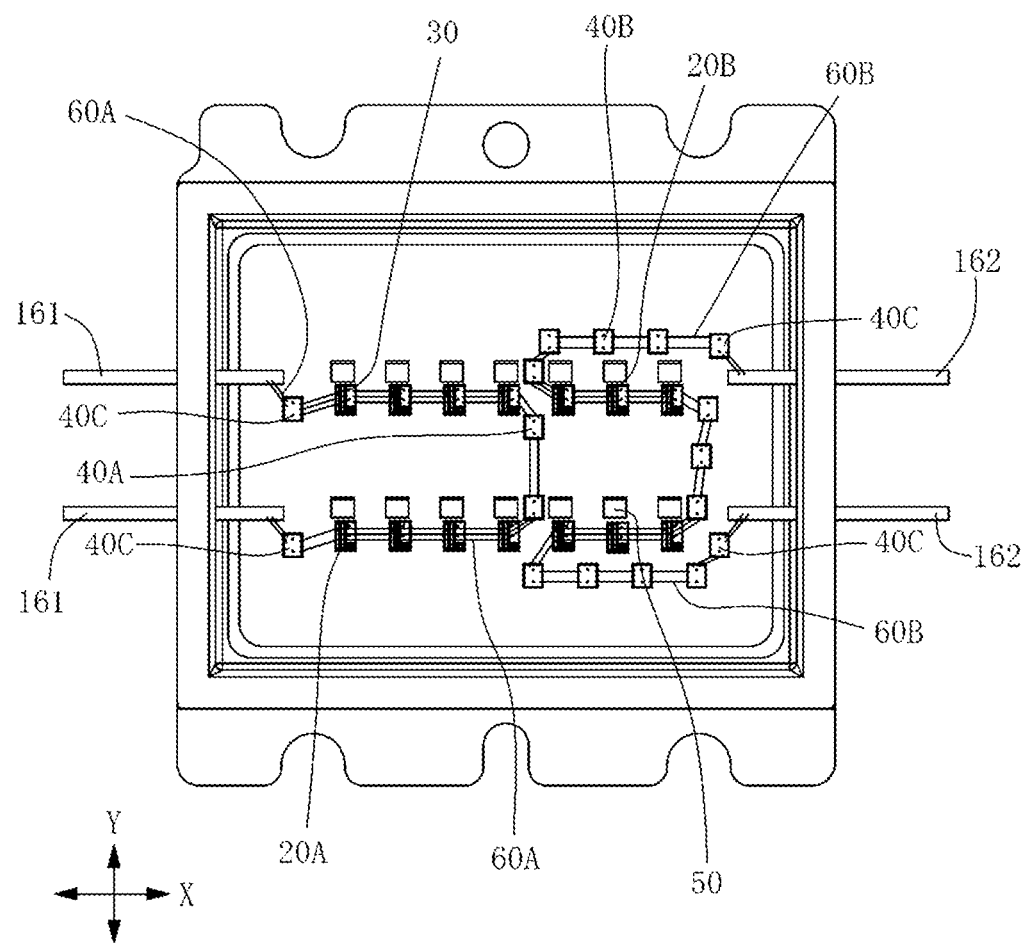

[FIG.12]
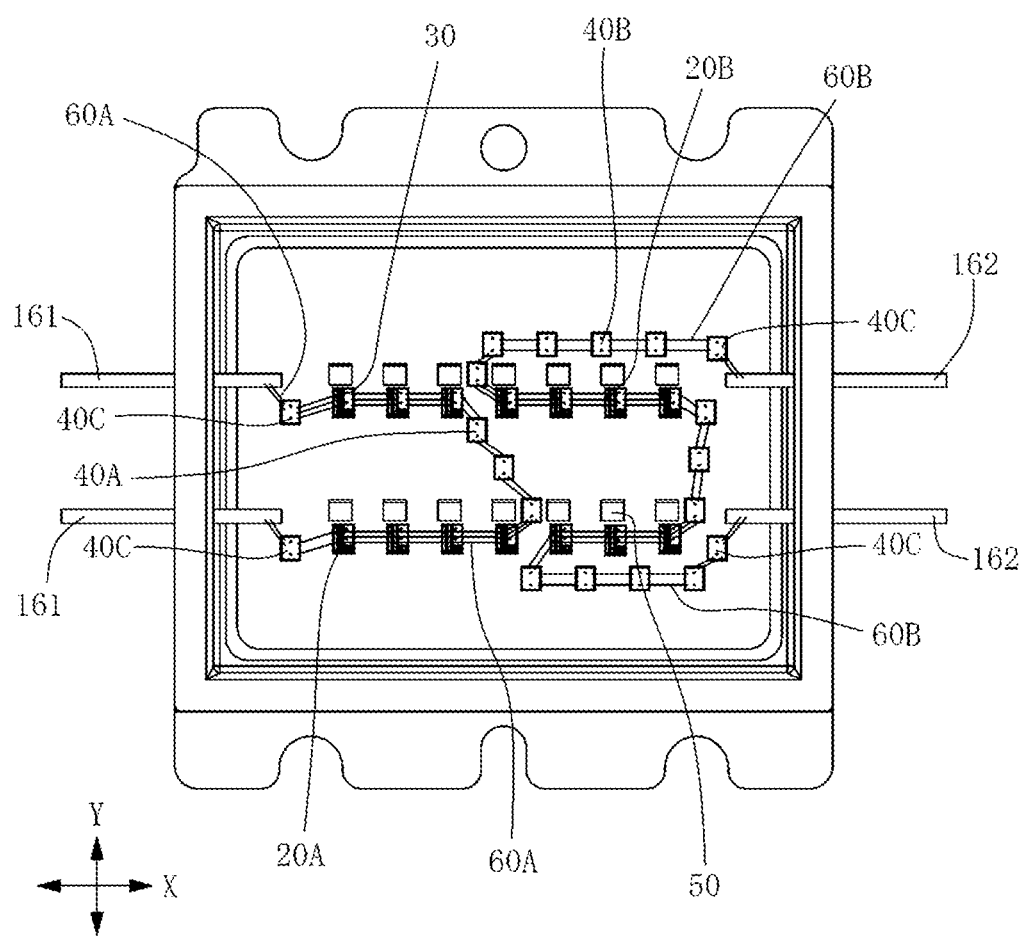

[FIG.13]
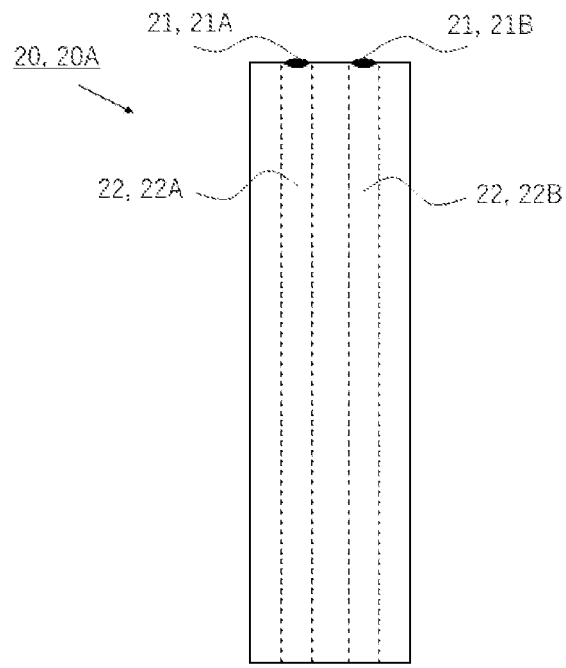
[FIG.14A]
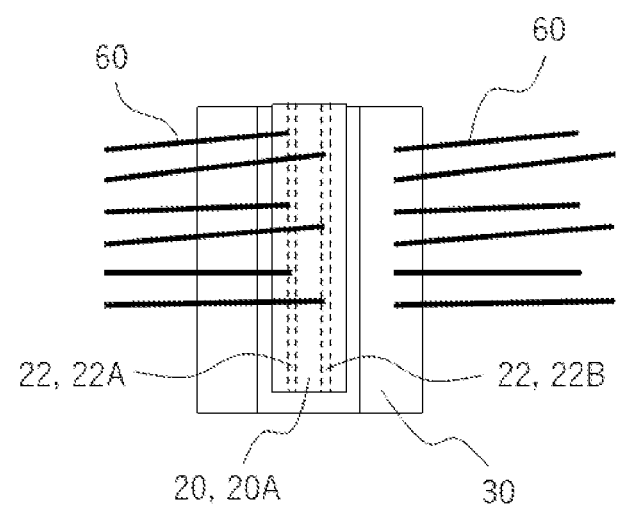

[FIG.14B]
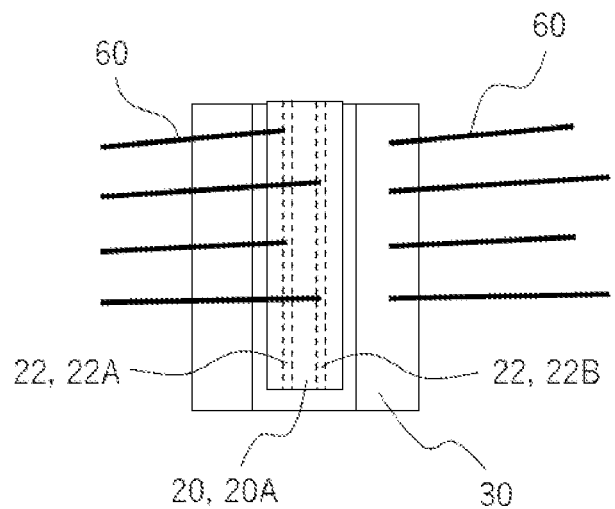
[FIG.15A]
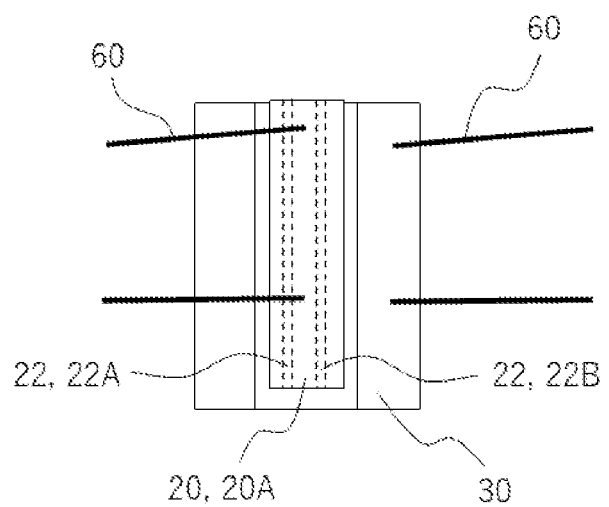

[FIG.15B]
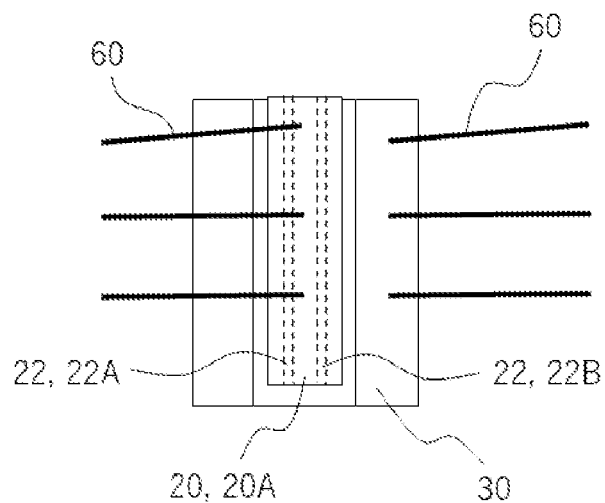
[FIG.15C]
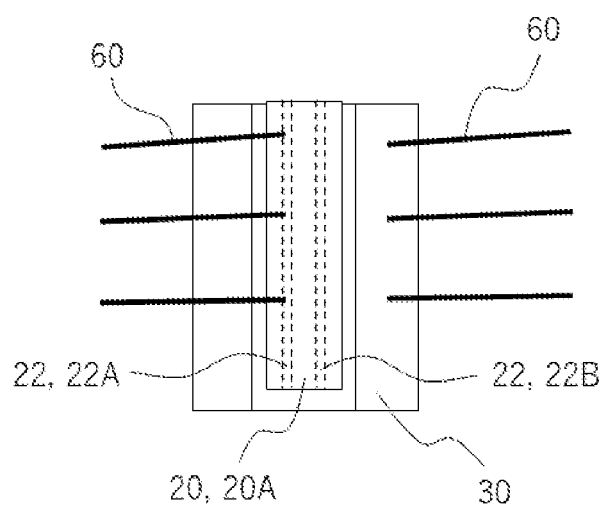

[FIG.15D]
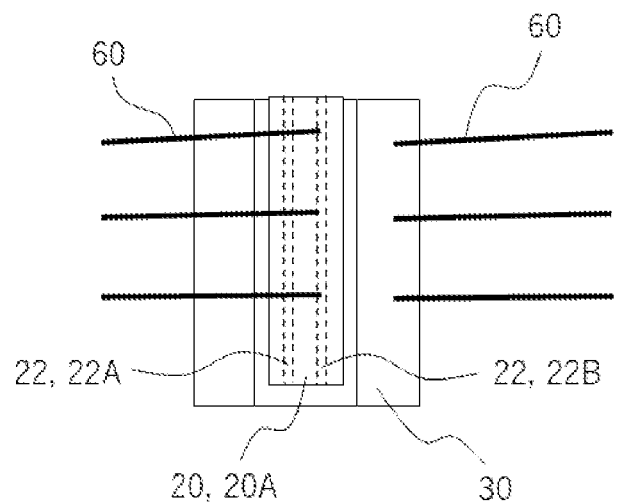
[FIG.15E]
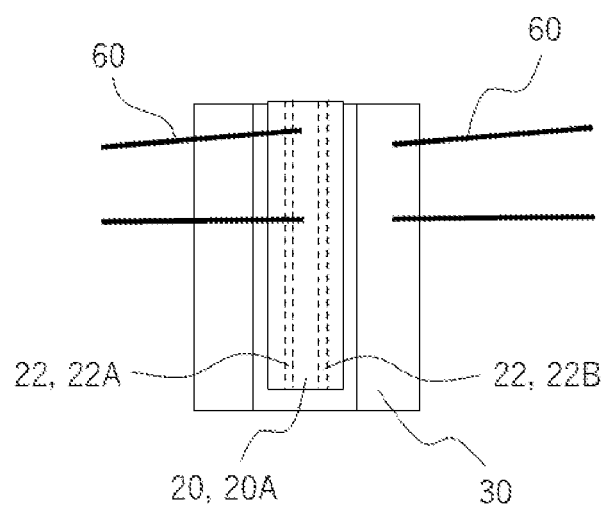

[FIG.15F]
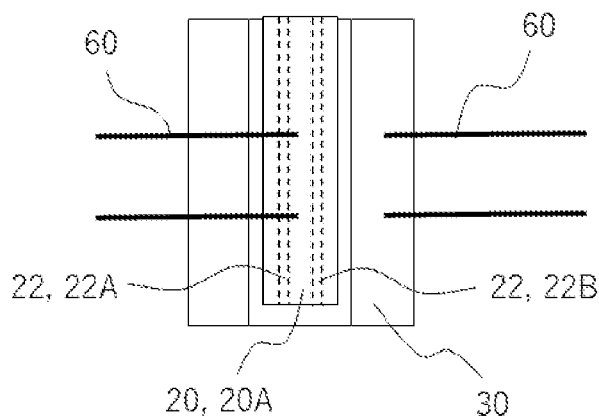
[FIG.16A]
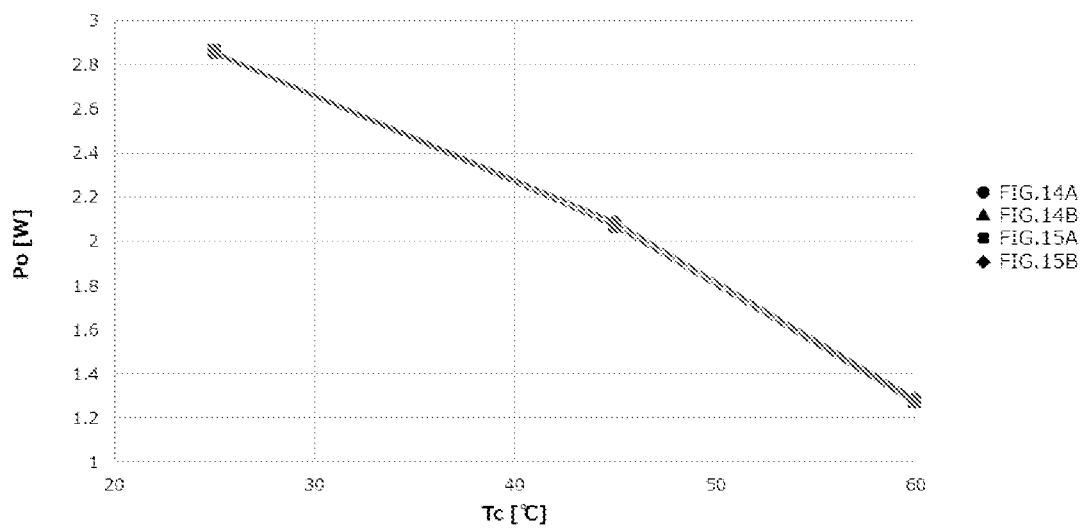
[FIG.16B]
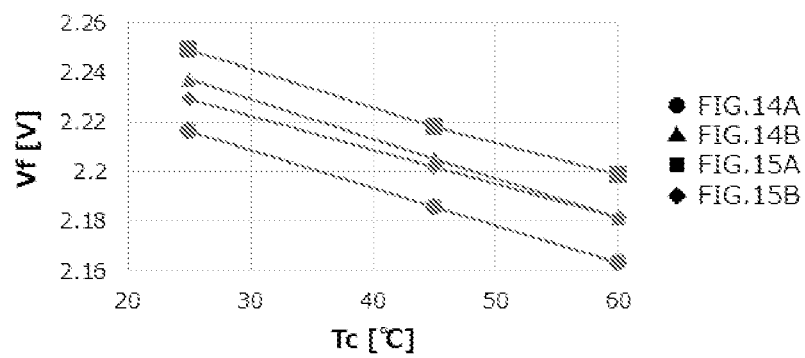

[FIG.16C]
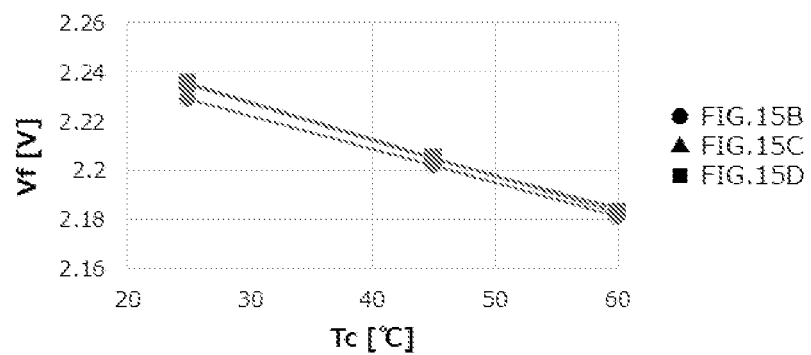
[FIG.16D]
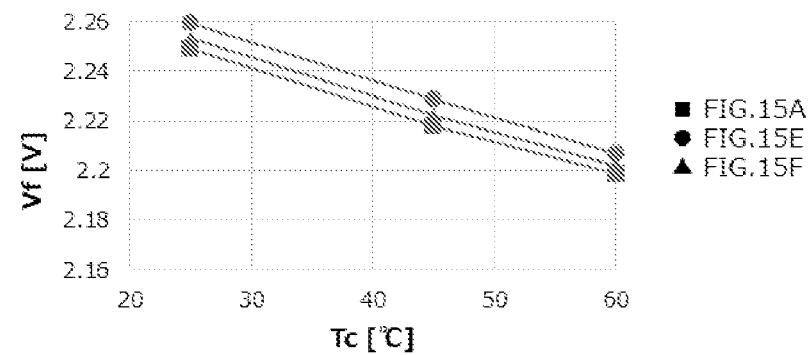

LIGHT EMITTING DEVICE

CROSS-REFERENCE TO RELATED APPLICATION

This application claims priority to Japanese Patent Application No. 2021-007966 filed on Jan. 21, 2021, Japanese Patent Application No. 2021-146580 filed on Sep. 9, 2021, and Japanese Patent Application No. 2021-211725 filed on Dec. 24, 2021, the disclosures of which are hereby incorporated by reference in their entireties.

BACKGROUND

The present invention relates to a light emitting device.

Japanese Patent Publication No. 2018-190750 discloses a light emitting device in which a relay member is disposed between a laser element and a lead terminal, and wirings for electrically connecting the laser element to the lead terminal are connected to the relay member to achieve the electrical connection via the relay member. Furthermore, the patent publication discloses an embodiment having a plurality of laser elements disposed in a matrix, in which multiple laser elements in each row are electrically connected in series such that multiple laser elements in units of rows can be independently driven.

SUMMARY

One object of the present disclosure is to provide a light emitting device in which light emitting elements disposed and electrically connected in a row are divided into two or more independently drivable groups.

The light emitting device disclosed by one embodiment includes: a base having a mounting face including a disposition region, the base including: a plurality of first wirings disposed apart from the disposition region in a first direction; and a plurality of second wirings disposed apart from the disposition region in the direction opposite the first direction; a plurality of light emitting elements, including one or more first light emitting elements, one or more second light emitting elements, and one or more third light emitting elements, the light emitting elements disposed in two rows and N columns (N≥2) in the disposition region, each having a light emitting point above the mounting face; one or more relay members, including one or more first relay members disposed in a region between the two rows of the light emitting elements in the disposition region; a plurality of first light emitting element wirings for electrically serially connecting the one or more first light emitting elements to two of the plurality of first wirings and the plurality of second wirings; a plurality of second light emitting element wirings for electrically serially connecting the one or more second light emitting elements to two of the plurality of first wirings and the plurality of second wirings; and a plurality of third light emitting element wirings for electrically serially connecting the one or more third light emitting elements to two of the plurality of first wirings and the plurality of second wirings. At least one of the two wirings that electrically serially connect the one or more first light emitting elements is not joined with any of the second light emitting element wirings or the third light emitting element wirings. At least one of the two wirings that electrically serially connect the one or more second light emitting elements is not joined with any of the first light emitting element wirings or the third light emitting element wirings. At least one of the two wirings that electrically serially connect the one or more third light emitting elements is not joined with any of the first light emitting element wirings or the second light emitting element wirings. The plurality of first light emitting element wirings include wirings that are connected to the one or more first relay members.

According to the present invention, a light emitting device in which the light emitting elements disposed and electrically connected in a row are divided into two or more independently drivable groups can be provided.

BRIEF DESCRIPTION OF THE DRAWINGS

FIG. 1 is a perspective view of a light emitting device according to several embodiments.

FIG. 2 is a top view of the light emitting device according to several embodiments.

FIG. 3 is a cross-sectional view of the light emitting device taken along line in FIG. 2, in which certain constituent elements are omitted.

FIG. 4 is a top view illustrating wirings of the light emitting device according to a First Embodiment.

FIG. 5 is a top view illustrating examples of the configurations of inter-row regions, intra-row regions, and outside-of-row regions in the light emitting device according to several embodiments.

FIG. 6 is a top view illustrating wirings of a light emitting device according to a First Variation of the First Embodiment.

FIG. 7 is a top view illustrating wirings of a light emitting device according to a Second Variation of the First Embodiment.

FIG. 8 is a top view illustrating wirings of a light emitting device according to a Third Variation of the First Embodiment.

FIG. 9 is a top view illustrating wirings of a light emitting device according to a Fourth Variation of the First Embodiment.

FIG. 10 is a top view illustrating wirings of a light emitting device according to a Second Embodiment.

FIG. 11 is a top view illustrating wirings of a light emitting device according to a First Variation of the Second Embodiment.

FIG. 12 is a top view illustrating wirings of a light emitting device according to a Second Variation of the Second Embodiment.

FIG. 13 is a schematic view of a light emitting device according to a Third Embodiment.

FIG. 14A is a top view illustrating an example of conventional wirings with respect to a light emitting element according to the Third Embodiment.

FIG. 14B is a top view illustrating another example of the conventional wirings with respect to the light emitting element according to the Third Embodiment.

FIG. 15A is a top view illustrating example wirings with respect to a light emitting element of a light emitting device according to the Third Embodiment.

FIG. 15B is a top view illustrating other example wirings with respect to a light emitting element of a light emitting device according to the Third Embodiment.

FIG. 15C is a top view illustrating other example wirings with respect to a light emitting element of a light emitting device according to the Third Embodiment.

FIG. 15D is a top view illustrating other example wirings with respect to a light emitting element of a light emitting device according to the Third Embodiment.

FIG. 15E is a top view illustrating other example wirings with respect to a light emitting element of a light emitting device according to the Third Embodiment.

FIG. 15F is a top view illustrating other example wirings with respect to a light emitting element of a light emitting device according to the Third Embodiment.

FIG. 16A is a graph showing a comparison of temperature characteristics of the optical outputs between the example wirings in FIG. 14A, FIG. 14B, FIG. 15A, and FIG. 15B.

FIG. 16B is a graph showing a comparison of temperature characteristics of the forward voltages between the example wirings in FIG. 14A, FIG. 14B, FIG. 15A, and FIG. 15B.

FIG. 16C is a graph showing a comparison of the temperature characteristics of the forward voltages between the example wirings in FIG. 15B, FIG. 15C, and FIG. 15D.

FIG. 16D is a graph showing a comparison of the temperature characteristics of the forward voltages between the example wirings in FIG. 15A, FIG. 15E, and FIG. 15F.

DETAILED DESCRIPTION

In the description and the accompanying claims, a polygon, such as a triangle, rectangle, or the like, including a shape subjected to processing of a corner of the polygon, such as cutting angles, beveling, chamfering, rounding, or the like, will be referred to as a "polygon." Moreover, the location of such processing is not limited to a corner (an end of a side). Rather, a shape subjected to processing in the intermediate portion of a side will similarly be referred to as a polygon. In other words, any polygon-based shape subjected to processing should be understood to be included in the interpretation of a "polygon" in the description and accompanying claims.

This similarly applies to any word describing a specific shape, such as a trapezoidal, circular, recessed, or projected shape, without being limited to a polygon. This also similarly applies to the sides defining such shapes. In other words, even if a corner or intermediate portion of a side is subjected to processing, the term "side" should be interpreted to include the processed portion. To distinguish a "polygon" or "side" that is intentionally not processed from a shape subjected to processing, the shape will be described by adding the phrase "exact," such as "an exact rectangle."

In the description or the accompanying claims, expressions such as up/down, left/right, front/back, forward/rearward, forepart/rear part, or the like merely describe the relative positions, orientations, or directions, and do not have to be matched by those in use.

In the accompanying drawings, directions, such as X, Y, and Z directions, might be indicated by using arrows. The directions indicated by the arrows are consistent among the drawings that are related to the same embodiment.

In the present specification, moreover, when explaining a constituent element, for example, the term such as "member" or "part/portion" may be used. A "member" refers to a subject physically handled by itself. A subject physically handled by itself is also considered as a component in a manufacturing process. On the other hand, a "part/portion" refers to a subject that does not have to be physically handled by itself. For example, the word "part/portion" is used to describe a portion of a member.

Describing something while making a distinction between the "member" and the "part/portion" described above is not meant to show the intent of consciously limiting the scope of the right under the doctrine of equivalents. In other words, even if there is a constituent element described as a "member" in the scope of claims, this alone does not constitute the recognition of the applicant that physically handling the constituent element by itself is essential in applying the present invention.

In the description or the accompanying claims, moreover, when there are multiple units of a certain element and a distinction must be made, a word such as "first," "second," or the like might occasionally be added. The subject to be distinguished can differ between the description and the scope of claims. Accordingly, even if a constituent element accompanied by the same word as that in the description is present in the claims, the subject identified by the constituent element might not match between the description and the claims.

For example, in the case in which there are a plurality of elements denoted and distinguished by "first," "second," and "third" in the description, and a certain claim recites only those that are referred to as the "first" and "third" in the description, the elements might be distinguished by adding the "first" and "second" in the claim for comprehensible purpose. In this case, the elements accompanied by the words "first" and "second" in the claim refer to the elements accompanied by the words "first" and "third" in the description. This rule applies not only to constituent elements, but also other subjects in a reasonable and flexible manner.

Certain embodiments of the present invention will be explained below. Moreover, specific embodiments implementing the present invention will be explained with reference to the drawings. The present invention is not limited to the specific embodiments. In other words, the embodiments illustrated are not the only embodiments in which the present invention can be realized. The sizes and relative positions of the members shown in the drawings might be exaggerated for clarity of explanation.

First Embodiment

A light emitting device 1 according to a First Embodiment will be explained. FIG. 1 to FIG. 5 are drawings illustrating one embodiment of the light emitting device 1 provided for exemplification purposes. FIG. 1 is a perspective view of the light emitting device 1. FIG. 2 is a top view of the light emitting device 1. FIG. 3 is a cross-sectional view taken along line in FIG. 2. In FIG. 3, the constituent elements disposed on the base part 12 are omitted so as not to make the drawing excessively complex. FIG. 4 is a top view illustrating the wiring for electrically connecting the light emitting elements in the light emitting device 1. FIG. 5 is a top view showing examples of the definitions of the inter-row regions, the intra-row regions, and the outside-of-row regions discussed later for the light emitting device 1.

The light emitting device 1 includes a plurality of constituent elements. The constituent elements include a base 10, a plurality of light emitting elements 20, a plurality of submounts 30, one or more relay members 40, a plurality of reflective members 50, a plurality of wirings 60, a sealing member 70, and a lens member 80.

The light emitting device 1 may include other elements besides those described above. For example, the light emitting device 1 may include additional light emitting elements besides the light emitting elements 20. Furthermore, the light emitting device 1 does not have to include a certain element among those listed here.

Each constituent element of the light emitting device 1 will be explained.

Base 10

A base 10 has a base part 12 and a wall part 14. The base part 12 has a mounting face on which other constituent elements are mounted. The wall part 14 surrounds the mounting face. The mounting face is the upper face of the base part 12, and the wall part 14 constitutes a lateral wall extending higher above the mounting face.

The base part 12 has a projected portion 12a. In other words, the base part 12 has a first face, a second face located at a higher level than the first face, and one or more lateral faces that link the first face and the second face. The second face can serve as the mounting face. The lateral wall can be formed outward of the second face. In other words, the wall part 14 can be formed to surround the entire second face.

In the base part 12, the shape of the region surrounded by the wall part 14 is rectangular. The long sides of the rectangular shape can be set to fall within the 15 mm to 35 mm range, and the short sides to fall within the 10 mm to 25 mm range. The long sides can be 1.4 to 2.5 times the short sides. In the example of the base 10 illustrated in the drawings, the long sides are in parallel with the X direction, and the short sides are in parallel with the Y direction.

In a top view, the mounting face is rectangular. The long sides of the rectangular shape are in parallel with the long sides of the region surrounded by the wall part 14, and the short sides of the rectangular shape are in parallel with the short sides of the region surrounded by the wall part 14. The long sides of the rectangular shape can be 0.75 to 1 times the long sides of the region surrounded by the wall part 14, and the short sides of the rectangular shape can be 0.7 to 1 times the short sides of the region surrounded by the wall part 14.

The base part 12 and the wall part 14 can be formed of different materials. For example, the base part 12 can be formed of a base material formed by using any of copper, copper tungstate, copper molybdenum, steel, and iron as a primary material, and the wall part 14 can be formed of a wall material formed by using steel or iron as a primary material. Specific examples include a base 10 formed by bonding a base material formed of oxygen-free copper as a primary material, and a wall material formed of mild steel having a carbon content in the 0.12% to 0.30% range as a primary material.

A primary material is one having the largest percentage by mass or volume in a formed object. If a formed object is formed of one material, that material is the primary material. In other words, a certain material being a primary material can include the instance in which the percentage of the material in an object is 100%.

In the case in which the base part 12 and the wall part 14 are formed of different materials as described above, the shape of the base part 12 that includes a projected portion 12a can suppress the mounting face from warping. The shape of the base 10 is not limited to this, and it may have, for example, a sheet shape. A sheet shaped base 10 does not have a wall part 14.

The base 10 further includes a plurality of wirings 16. The wirings 16 include a first wiring 161 and a second wiring 162 that oppose one another across the mounting face. The wirings 16 include a plurality of first wirings 161. The wirings 16 include a plurality of second wirings 162. The wirings 16 include as many second wirings 162 as the first wirings 161.

Each wiring 16 has an inner wiring portion located inward of the lateral wall, and an external wiring portion located outward of the lateral wall. The inner wiring portion and the outer wiring portion of a wiring 16 are electrically continuous. For example, the wirings 16 pass through the wall part 14.

The wirings 16 can be lead pins that pass through the wall part 14. The wirings 16 can alternatively be formed of, for example, a metal film disposed on the upper face of the base 10. The wirings 16 can be formed by using a metal, such as, kovar, copper, or iron as a primary material.

Light Emitting Element 20

A light emitting element 20 emits light. The light emitting element 20 has an upper face, a lower face, and one or more lateral faces among which one or more faces are the light emitting face(s) through which light exits. The light emitting element 20 emits light from one or more points of the light emitting face(s). The points will be referred to as light emitting points. A specific example of a light emitting element 20 is a semiconductor laser element.

For the light emitting element 20, for example, a blue light emitting element, a green light emitting element, or a red light emitting element can be employed. A light emitting element emitting light of another color besides these can be employed for the light emitting element 20.

Here, blue light refers to the light having a peak emission wavelength falling within the 420 nm to 494 nm range. Green light refers to the light having a peak emission wavelength falling within the 495 nm to 570 nm range. Red light refers to the light having a peak emission wavelength falling within the 605 nm to 750 nm range.

A semiconductor laser element will now be explained. A semiconductor laser element has a rectangular outline having opposite long sides and opposite short sides in the top view. A semiconductor laser element is formed by stacking multiple semiconductor layers including an active layer in the direction from the lower face to the upper face. A lateral face including one of the two short sides of the rectangle is the emission end face through which light exits. The emission end face of a semiconductor laser element can be said as the light emitting face of a light emitting element 20. The upper face and the lower face of a semiconductor laser element have larger areas than the emission end face.

The light (laser beam) emitted from a semiconductor laser element spreads. The divergent light exits the emission end face of the semiconductor laser element. The light emitted from a semiconductor laser element forms an elliptical far field pattern (hereinafter referred to as "FFP") in a plane parallel with the emission end face. Here, FFP refers to the shape and light intensity distribution of the emitted light at a location distant from the emission end face.

Here, the light passing the center of the elliptical FFP, in other words, the light having the peak intensity in the light intensity distribution of the FFP will be referred to as the light advancing or passing along the optical axis. Moreover, the light having an intensity of at least $1/e^2$ relative to the peak intensity value based on the light intensity distribution of an FFP will be referred to as the main portion of the emitted light.

The shape of the FFP of the emitted light from a semiconductor laser element is an ellipse that is longer in the stacking direction than in the direction perpendicular to the stacking direction. The stacking direction refers to the direction in which a plurality of semiconductor layers including an active layer are stacked in a semiconductor laser element. The direction perpendicular to the stacking direction can also be referred to as the direction along a semiconductor layer plane. The long diameter direction of the elliptical shape of the FFP can also be referred to as the fast axis direction of the semiconductor laser element, and the short diameter direction the slow axis of the semiconductor laser element.

The light emitted from a semiconductor laser element is divergent light. Here, the angle at which the light having an intensity of $1/e^2$ of the peak intensity based on the light intensity distribution of the FFP spreads will be referred to as the beam spread angle of the semiconductor laser element. Besides the $1/e^2$ intensity of the peak light intensity, the beam spread angle is occasionally obtained from the light intensity that is one half of the peak light intensity, for example. In the present specification, when simply referred to as a "beam spread angle," it refers to the beam spread angle at the $1/e^2$ intensity of the peak light intensity. It can be said that the spread angle in the fast axis direction is larger than the spread angle in the slow axis direction.

Examples of a blue or green light emitting semiconductor laser element include a semiconductor laser element that includes a nitride semiconductor. For the nitride semiconductors, for example, GaN, InGaN, or AlGaN can be used. Examples of a red light emitting laser element include those that include an InAlGaP-based, GaInP-based, GaAs-based, or AlGaAs-based semiconductor.

Submount 30

A submount 30 has a lower face, an upper face, and one or more lateral faces. The width of the submount 30 is smallest in the up/side direction. The submount 30 has a rectangular cuboid shape. The shape is not limited to a rectangular cuboid. The submount 30 can be formed by using, for example, aluminum nitride, silicon nitride, or silicon carbide as a primary material.

Relay Member 40

A relay member 40 has a lower face, an upper face, and one or more lateral faces. The width of the relay member 40 is smallest in the up/down direction. The relay member 40 has a rectangular cuboid shape. The shape is not limited to a rectangular cuboid. The relay member 40 can be formed by using, for example, silicon nitride, aluminum nitride, silicon carbide, or aluminum oxide as a primary material.

Reflective Member 50

A reflective member 50 has a light reflecting face that reflects light. The reflective member 50 has a lower face and an upper face, and the light reflecting face is oblique to the lower face of the reflective member 50. In other words, the light reflecting face is not orthogonal to or in parallel with the lower face of the reflective member 50. The light reflecting face is a flat face, and forms an oblique angle of 45 degrees with the lower face of the reflective member 50. The light reflecting face does not have to be a flat face or have a 45 degree oblique angle.

The reflective member 50 can be formed by using glass or a metal as a primary material. A heat resistant material is suited for the primary material, and for example, glass such as quartz or BK7 (borosilicate glass), a metal such as aluminum can be used. The reflective member 50 can alternatively be formed by using Si as a primary material. In the case in which the primary material is a reflective material, the light reflecting face can be formed of the primary material. In the case of forming a light reflecting face by using a material different from the primary material, the light reflecting face can be formed by forming, for example, a metal film such as Ag or Al, or a multilayer dielectric film, such as $Ta_2O_5/SiO_2$, $TiO_2/SiO_2$, $Nb_2O_5/SiO_2$, or the like.

The light reflecting face has a reflectance of at least 90% with respect to the peak wavelength of the light irradiated on the light reflecting face. The reflectance may be at least 95%. The reflectance here is 100% at most or lower than 100%.

Wiring 60

A wiring 60 is a linear conductor having joint portions at both ends. In other words, a wiring 60 has joint portions to be joined with other constituent elements at both ends of the linear portion. A wiring 60 is used for electrically connecting two elements. For the wiring 60, for example, a wire formed of a metal as a primary material can be used. Examples of metals include gold, aluminum, silver, and copper.

Sealing Member 70

A sealing member 70 has an upper face and a lower face. The sealing member 70 has a light transmitting portion having high transmissivity through the member from the upper face to the lower face. Having high transmissivity means that the light transmittance is at least 80%. It does not have to have a light transmittance of at least 80% with respect to light of all wavelengths.

The sealing member 70 may be formed of a frame member with one or more openings, and one or more light transmitting members that plug the one or more openings. In this case, the frame member does not have to have high transmissivity. The light transmitting member(s) include a light transmitting portion.

The light transmitting portion in the sealing member 70 can be formed by using a light transmissive material, such as glass, sapphire, or quartz as a primary material. As a primary material for the frame member, for example, a metal can be used.

Lens Member 80

A lens member 80 has an upper face, a lower face, lateral faces, and a plurality of lens faces. The lens faces are provided on the upper face side. The lens faces are disposed in a matrix, 2 rows×N columns (N is 2 or higher natural number). The lens faces may be disposed on the lower face side.

The upper face and the lower face are flat faces. The lens faces meet the upper face. The lens faces are surrounded by the upper face in the top view. In the top view, the outline of the lens member 80 is rectangular. The lower face of the lens member 80 is rectangular.

Here, in the lens member 80, the portion that overlaps the lens faces in the top view will be referred to as the lens portion. In the lens member 80, the portion that overlaps the upper face in the top view will be referred to as the non-lens portion. When the lens portion is halved by an imaginary plane that includes the upper face, the lens face side will be referred to as the lens shaped portion, and the lower face side will be referred to as the sheet shaped portion. The lower face of the lens portion is a part of the lower face of the lens member 80.

The lens member 80 has high transmissivity. The lens portion is formed to have high transmissivity in whole. The lens member 80 can be formed by using a light transmissive material, such as glass or synthetic quartz, as a primary material.

Light Emitting Device 1

A light emitting device 1 that includes the constituent elements described above will be explained next.

In a light emitting device 1, a plurality of light emitting elements 20 are disposed on the base 10. The light emitting elements 20 are disposed on the mounting face of the base 10. The light emitting points of the light emitting elements 20 are all positioned above the mounting face. The light emitting elements 20 are disposed in the disposition region of the mounting face. It can be considered that the disposition region is a region within the mounting face that can surround the light emitting elements 20 disposed on the mounting face.

The light emitting elements 20 are disposed in a matrix. The light emitting elements 20 are disposed in two rows and N columns (N is 2 or higher natural number). The light emitting points of the N light emitting elements 20 in the same row can be disposed at equal intervals in the row direction. The light emitting device 1 may have more light emitting elements such that they are disposed in a matrix having three or more rows as a whole. Similarly, more light emitting elements may be disposed such that the number of columns is greater than N.

The spacing between adjacent light emitting elements 20 in the row direction is 1.2 mm to 4 mm. The spacing between adjacent light emitting elements 20 in the row direction is smaller than the spacing between adjacent light emitting elements 20 in the column direction. The spacing between adjacent light emitting elements 20 in the column direction is 4 mm to 8 mm.

In the case of the light emitting device 1 illustrated in the drawings, the row direction in the matrix is in parallel with the X direction and the column direction is in parallel with the Y direction. For the light emitting elements 20, semiconductor laser elements are employed. Furthermore, the light emitting elements 20 are disposed in two rows and seven columns. The light emitting elements 20 are preferably disposed in 3 or more columns. This allows the long/short orientation of the disposition region to correspond to the long/short orientation of the mounting face, thereby facilitating the disposition of the light emitting elements in an efficient manner.

Using the disposition region as a reference point, the first wirings 161 and the second wirings 162 are disposed apart from the disposition region in the opposite directions. The first wirings 161 are positioned distant from the disposition region in a first direction, and the second wirings 162 are positioned distant from the disposition region in the direction opposite the first direction.

In the case of the light emitting device 1 illustrated in the drawings, the first direction and the direction opposite the first direction parallel the X direction. As many first and second wirings 161 and 162 as the number of rows of the light emitting elements 20 disposed in a matrix are provided. In other words, the first wirings 161 and the second wirings 162 are formed of two wirings 16 each.

The light emitting elements 20 include one or more first light emitting elements 20A, one or more second light emitting elements 20B, and one or more third light emitting elements 20C. The first light emitting element(s) 20A, the second light emitting element(s) 20B, and the third light emitting element(s) 20C are electrically connected so as to be independently driven. How they are connected will be described in detail later.

The first light emitting element(s) 20A, the second light emitting element(s) 20B, and the third light emitting element(s) 20C emit light of different colors. The first light emitting element(s) 20A, the second light emitting element(s) 20B, and the third light emitting element(s) 20C emit light of different colors from one another selected from red light, green light, and blue light.

A plurality of first light emitting elements 20A emit light of the same color. The differences among the peak wavelengths of the light emitted by the first light emitting elements 20A are 30 nm at most. The same is true for the second light emitting elements 20B and the third light emitting elements 20C.

The first light emitting elements 20A can include two or more first light emitting elements 20A among which the peak wavelengths of the light emitted differ from 3 nm to 10 nm from one another. Such a peak wavelength difference is preferably 3 nm to 5 nm. For example, in the case of using laser light emitted from a light emitting device 1 in displaying an image, allowing the elements to emit light of the same color but different wavelengths can reduce the speckle noise. The second light emitting elements 20B and the third light emitting elements 20C can similarly be constructed to emit light of different peak wavelengths.

In the case of the light emitting device 1 illustrated in the drawings, the light emitting elements disposed in the second row from the first to the seventh columns are the first light emitting elements 20A, those disposed in the first row in the first, the second, the sixth, and the seventh columns are the second light emitting elements 20B, and those disposed in the first row from the third to the fifth columns are the third light emitting elements 20C. The first light emitting elements 20A emit red light, the second light emitting elements 20B emit green light, and the third light emitting elements 20C emit blue light.

In the case of the light emitting device 1 illustrated in the drawings, the first light emitting elements 20A include a first light emitting element 20A emitting light of a peak wavelength that is a first wavelength, and a first light emitting element 20A emitting light of a peak wavelength that is a second wavelength higher than the first wavelength. The second wavelength is higher than the first wavelength by 3 nm to 10 nm. The first light emitting elements 20A further include a first light emitting element 20A emitting light of a peak wavelength that is a third wavelength higher than the second wavelength. The third wavelength is higher than the second wavelength by 3 nm to 10 nm.

Preferably, the third wavelength is higher than the first wavelength by 3 nm to 10 nm. Furthermore, the second wavelength is higher than the first wavelength by 3 nm to 5 nm, and the third wavelength is higher than the second wavelength by 3 nm to 5 nm. By controlling the difference between the maximum and the minimum peak wavelengths of the light emitted by the light emitting elements that emit the same color light to 10 nm at most, light without a considerable variation in hue can be output.

The light emitting elements 20 are disposed such that their light emitting faces all face in a lateral direction. The light emitting elements 20 are disposed such that the light emitting faces face in the same direction. Here, the same direction in the top view includes a tolerance of ±5 degrees formed by the light emitting faces with the direction. In the case of the light emitting device 1 illustrated in the drawings, the light emitting faces of the light emitting elements 20 are in parallel with the X direction and orthogonal to the Y direction. The optical axis of the light emitted by each of the light emitting elements 20 is in parallel with the Y direction.

Each light emitting element 20 is disposed on a submount 30. Each light emitting element 20 is disposed on the mounting face via a submount 30. A plurality of light emitting elements 20 are disposed on a plurality of submounts 30. The submounts 30 are provided for the light emitting elements 20 on a one-to-one basis.

The submounts 30 include the submounts 30 of two or more different sizes in the top view. In the case of the light emitting device 1 illustrated in the drawings, among the two differently sized submounts 30, the first light emitting elements 20 are bonded to the submounts 30 having a larger area. This can increase the heat dissipation performance with respect to the first light emitting elements 20A.

A plurality of reflective members 50 are disposed on the substrate 10. The reflective members 50 are disposed on the mounting face of the base 10. The reflective members 50 are disposed in the disposition region of the mounting face. It can be considered that the disposition region is a region within the mounting face which can surround the reflective members 50 and the light emitting elements 20 disposed on the mounting face.

The reflective members 50 reflect the light emitted by the light emitting elements 20. The light reflected by each reflective member 50 advances upwards. The light reflecting face of each reflective member 50 is oblique at a 45 degree angle to the direction of the light advancing along the optical axis. The light advancing along the optical axis is reflected by a light reflective member 50 to advance in the direction orthogonal to the mounting face. This direction is in parallel with the Z direction.

The main portions of the light from the light emitting elements 20 are reflected by the reflective members 50. Hereinafter, the reflective member 50 that reflects the main portion of the light from a light emitting element 20 might occasionally be referred to as the reflective member 50 corresponding to the light emitting element 20.

The reflective members 50 include one or more reflective members 50 corresponding to one or more first light emitting elements 20A, one or more reflective members 50 corresponding to one or more second light emitting elements 20B, and one or more reflective members 50 corresponding to one or more third light emitting elements 20C.

The reflective members 50 are provided for the light emitting elements 20 on a one-to-one basis. The reflective members 50 are disposed in a matrix. The light reflective members 50 are disposed in two rows and N columns (N is 2 or higher natural number). The N reflective members 50 disposed in a row can be positioned at equal intervals. The reflective members 50 may include a reflective member 50 that corresponds to multiple light emitting elements 20 consecutively disposed.

For example, the reflective members 50 may include a reflective member 50 that corresponds to multiple consecutively disposed first light emitting elements 20A, a reflective member 50 that corresponds to multiple consecutively disposed second light emitting elements 20B, and a reflective member 50 that corresponds to multiple consecutively disposed third light emitting elements 20C.

The light reflecting face of each reflective member 50 reflects at least 90% of the main portion of the irradiated light. The light emitting device 1 does not have to have the light reflective members 50. In this case, for example, the emission end faces of the light emitting elements 20 face up.

One or more relay members 40 are disposed on the base 10. The one or more relay members 40 are disposed on the mounting face. The one or more relay members 40 include one or more first relay members 40A disposed in the inter-row region between the light emitting elements 20 that are disposed in two rows and N columns.

An inter-row region is a region between the rows of constituent elements disposed in two rows and N columns, i.e., the region between the elements in the first row and the elements in the second row. Accordingly, an inter-row region between the light emitting elements 20 disposed in two rows, an inter-row region between the reflective members 50 disposed in two rows, an inter-row region between the light emitting elements in the first row and the reflective members 50 in the second row, and an inter-row region between the reflective members 50 in the first row and the light emitting elements 20 in the second row can be defined, which hereinafter will be referred to as the first inter-row region, the second inter-row region, the third inter-row region, and the fourth inter-row region, respectively.

An inter-row region is a region interposed between two imaginary lines parallel with the row direction in the top view. One of the two imaginary lines is the imaginary line passing through the elements in the first row at the closest positions to the elements in the second row, and the other is the imaginary line passing through the elements in the second row at the closest positions to the elements in the first row. In FIG. 5, the first inter-row region A1 as an example of the inter-row regions is marked with hatching.

One or more first relay members 40A are disposed in the region in which the first inter-row region, the second inter-row region, the third inter-row region, and the fourth inter-row region overlap. The one or more first relay members 40A can be disposed in either the third inter-row region or the fourth inter-row region, whichever one in which the light emitting elements 20 and reflective members 50 are absent.

The one or more relay members 40 include one or more second relay members 40B that are disposed in the outside-of-row region of the light emitting elements 20 disposed in two rows and N columns. An outside-of-row region is a region defined by an imaginary line used as a border parallel with the row direction and passing through positions of certain constituent elements disposed in multiple columns in one of the two rows, the positions farthest from the other row, where the outside-of-row region is the region that does not include the constituent elements.

Accordingly, an outside-of-row region based on the light emitting elements 20 disposed in the first row, an outside-of-row region based on the reflective members 50 disposed in the first row, an outside-of-row region based on the light emitting elements 20 disposed in the second row, and an outside-of-row region based on the reflective members 50 disposed in the second row can be defined, which hereinafter will be referred to as the first outside-of-row region, the second outside-of-row region, the third outside-of-row region, and the fourth outside-of-row region, respectively. In FIG. 5, as an example of the outside-of-row regions, the first outside-of-row region A3 is marked with hatching.

The one or more relay members 40 include one or more third relay members 40C each being joined with one end of a wiring 60 that is connected to a wiring 16 at the other end. A third relay member 40C is disposed at a position distant from the light emitting element 20 positioned at one end of a row of light emitting elements 20 in the direction opposite the direction in which the adjacent light emitting element 20 is disposed. In contrast to the third relay member 40C, the first relay member 40A and the second relay member 40B can be relay members to which the wirings 60 not connected to the wiring 16 at either end are respectively connected.

In addition to the inter-row regions and the outside-of-row regions, an intra-row region can be defined. An intra-row region is a region interposed between the inter-row region and the outside-of-row region specified based on certain constituent elements disposed in the same row and multiple columns. In FIG. 5, as an example of such an intra-row region, the intra-row region A2 based on the light emitting elements 20 disposed in the first row is marked with hatching. This intra-row region A2 is the region interposed between the first inter-row region A1 and the first outside-of-row region A3.

In the case of the light emitting device 1 illustrated in FIG. 4, the form in which a relay member 40 is disposed in the intra-row region based on the light emitting elements 20 disposed in the first row is shown. It also shows the form in which relay members 40 are disposed in the intra-row region based on the reflective members 50 disposed in the first row.

The wirings 60 are disposed to electrically connect the light emitting elements 20 to the wirings 16. The wirings 60 include a plurality of first light emitting element wirings 60A that electrically serially connect the one or more first light emitting elements 20A to two wirings 16 among the first wirings 161 and the second wirings 162.

The wirings 60 include a plurality of second light emitting element wirings 60B that electrically serially connect the one or more second light emitting elements 20B to two wirings 16 among the first wirings 161 and the second wirings 162.

The wirings 60 include a plurality of third light emitting element wirings 60C that electrically serially connect the one or more third light emitting elements 20C to two wirings 16 among the first wirings 161 and the second wirings 162.

A first light emitting element wiring 60A is joined with each of the two wirings 16 that electrically serially connect the one or more first light emitting elements 20A. Neither a second light emitting element wiring 60B nor a third light emitting element wiring 60C is joined with at least one of these two wirings 16.

A second light emitting element wiring 60B is joined with each of the two wirings 16 that electrically serially connect the one or more second light emitting elements 20B. Neither a first light emitting element wiring 60A nor a third light emitting element wiring 60C is joined with at least one of these two wirings 16.

A third light emitting element wiring 60C is joined with each of the two wirings 16 that electrically serially connect the one or more third light emitting elements 20C. Neither a first light emitting element wiring 60A nor a second light emitting element wiring 60B is joined with at least one of these two wirings 16.

The wirings 16 include a wiring 16 with which a first light emitting element wiring 60A, a second light emitting element wiring 60B, and a third light emitting element wiring 60C are joined. This wiring 16 is one of the first wirings 161 and the second wirings 162.

The first light emitting element wirings 60A include a wiring 60 that is joined with a first relay member 40A. This first relay member 40A may be a first relay member 40A based on any of the first to fourth inter-row regions. The first light emitting element wirings 60A include wirings 60 joined with one or more first relay members 40A, and wirings 60 joined with one or more first light emitting elements 20 or one or more submounts 30 on which the one or more first light emitting elements 20A are mounted.

The one or more first light emitting elements 20A are electrically connected to the two first wirings 161. The first light emitting element wirings 60A are joined with the one or more first relay members 40A positioned on the opposite side of the one or more first light emitting elements 20A relative to the one or more reflective members 50 that correspond to the one or more first light emitting elements 20A.

The first light emitting element wirings 60A are joined with the one or more first light emitting elements 20A and the one or more first relay members 40A so as to surround the one or more reflective members 50 that correspond to the one or more first light emitting elements 20A.

In the case of the light emitting device 1 illustrated in the drawings, the first light emitting element wirings 60A are joined so as to successively link the one of the two first wirings 161 that is closer to the first light emitting elements 20A, the first light emitting elements 20A disposed in the row direction, the relay members 40, and the other first wiring 161. There is no first light emitting element wiring 60A that passes between any two adjacent reflective members 50 disposed in a row direction that correspond to the first light emitting elements 20A.

The second light emitting element wirings 60B include a wiring 60 that is joined with a second relay member 40B. This second relay member 40B is either the second relay member 40B disposed in the outside-of-row region based on the second light emitting elements 20B or the second relay member 40B disposed in the outside-of-row region based on the reflective members 50 corresponding to the second light emitting elements 20B. The second light emitting element wirings 60B include wirings 60 joined with one or more second relay members 40B, and wirings 60 joined with the one or more second light emitting elements 20B or the one or more submounts 30 on which the one or more second light emitting elements 20B are mounted.

The one or more second light emitting elements 20B are electrically connected to one of the first wirings 161 and one of the second wirings 162. The second light emitting element wirings 60B are joined with the one or more second relay members 40B positioned on the opposite side of the one or more third light emitting elements 20C relative to the one or more reflective members 50 corresponding to the one or more third light emitting elements 20C. The second light emitting element wirings 60B include the second light emitting element wirings 60B that are joined with a relay member 40 disposed between two reflecting members 50 that correspond to a second light emitting element 20B and a third light emitting element 20C adjacently disposed in the row direction. This relay member 40 is a second relay member 40B disposed in the outside-of-row region based on the second light emitting elements 20B. This can achieve the electrical connection of the second light emitting elements 20B while bypassing the third light emitting elements 20C.

In the case of the light emitting device 1 illustrated in the drawings, in the same row, one or more second light emitting elements 20B are disposed in one direction from the third light emitting elements 20C, and one or more second light emitting elements 20B are disposed in the opposite direction of the one direction from the third light emitting elements 20C. Referring to these as the second light emitting elements 20B on one side and the second light emitting elements 20B on the other side, the second light emitting element wirings 60B are joined so as to successively link the first wiring 161 in the first row, the second light emitting elements 20B on one side, multiple relay members 40, the second light emitting elements 20B on the other side, and the second wiring 162 in the first row.

The third light emitting element wirings 60C include a wiring 60 that is joined with a first relay member 40A. This first relay member 40A may be a first relay member 40A that is based on any of the first to fourth inter-row regions. The third light emitting element wirings 60C include wirings 60 connected to the one or more first relay members 40A that are positioned closer to the first wirings 161 in the row direction than the third light emitting element 20C that is closest to the first wirings 161. The third light emitting element wirings 60C further include wirings 60 connected to the one or more first relay members 40A disposed closer to the second wirings 162 in the row direction than the third light emitting element 20C that is closest to the second wirings 162.

The one or more third light emitting elements 20C are electrically connected to one of the first wirings 161 and one of the second wirings 162. The third light emitting element wirings 60C are joined with the one or more first relay members 40A positioned closer in the column direction to the third light emitting elements 20C than the first relay member(s) 40A to which the first light emitting element wirings 60A are connected in the inter-row region. The third light emitting element wirings 60C include a third light emitting element wiring 60C that is joined with a relay member 40 that is positioned between a second light emitting element 20B and a third light emitting element 20C adjacently disposed in the row direction. The one or more first relay members 40A include a first relay member 40A that is joined with the wiring 60 whose other end is joined with a third light emitting element 20C or the submount 30 equipped with the third light emitting element 20C and the wiring 60 whose other end is joined with the first relay member 40A with which a first light emitting element wiring 60A is joined.

In the case of the light emitting device 1 illustrated in the drawings, the third light emitting element wirings 60C are joined so as to successively link the first wiring 161 in the first row, one or more first relay members 40A, the third light emitting elements 20C disposed in the row direction, one or more first relay members 40A, and the second wiring 162 in the second row.

The one or more relay members 40 include a relay member 40 with which a first light emitting element wiring 60A and a second light emitting element wiring 60B are joined. The wirings 60 include a wiring 60 that serves as both a first light emitting element wiring 60A and a second light emitting element wiring 60B. This can simplify the wiring.

The one or more relay members 40 include a relay member 40 with which a first light emitting element wiring 60A and a third light emitting element wiring 60C are joined. A first relay member 40A is applicable to this relay member 40. The wirings 60 include a wiring 60 that serves as both a first light emitting element wiring 60A and a third light emitting element wiring 60C. This can allow two current paths to converge at a desired position.

A relay member 40 with which a first light emitting element wiring 60A and a second light emitting element wiring 60B are joined may differ from a relay member 40 with which a first light emitting element wiring 60A and a third light emitting element wiring 60C are joined. This can adjust the number of wirings joined with a relay member 40.

In the configuration that allows for current path convergence in this manner, the wirings 60 would include those that function only as the first light emitting element wirings 60A, those that function only as the second light emitting element wirings 60B, those that function only as the third light emitting element wirings 60C, and those that function at least as the first light emitting element wirings 60A and the second light emitting element wirings 60B. The wirings 60 can include those that function at least as the first light emitting element wirings 60A and the third light emitting element wirings 60C. The wirings 60 can further include those that function as the first light emitting element wirings 60A, the second light emitting element wirings 60B, and the third light emitting element wirings 60C.

The relay members 40 include a relay member 40 at which current paths related to the first light emitting element(s) 20A, the second light emitting element(s) 20B, and the third light emitting element(s) 20C converge. A third relay member 40C is applicable to this relay member. The wirings 60 joined with the first relay member(s) 40A do not include the wirings 60 that function as the first light emitting element wirings 60A, function as the second light emitting element wirings 60B, and further function as the third light emitting element wirings 60C.

In the case of the light emitting device 1 illustrated in the drawings, the current path for electrically connecting the first light emitting elements 20A to two wirings 16 are configured to have a first section for electrically connecting only the first light emitting elements 20A, a second section for electrically connecting the first light emitting elements 20A and the third light emitting elements 20C, and a third section for electrically connecting the first light emitting elements 20A, the second light emitting elements 20B, and the third light emitting elements 20C. The physical lengths of the sections from longest to shortest are the first section, the second section, and the third section. The section length of the first section is at least twice the sum of the second section length and the third section length.

In the light emitting device 1, the relay members 40 include a relay member 40 that is smaller in area than that of a submount 30 in the top view. The relay members 40 can each have a smaller area than that of a submount 30. This can provide convenience in selecting the number or the positions of the relay members 40 that are disposed in the inter-row regions.

The number of relay members 40 disposed in the light emitting device 1 can be greater than 2×N. The number of relay members 40 disposed in the light emitting device 1 can be greater than the number of the light emitting elements 20. The number of relay members 40 disposed in the light emitting device 1 can be greater than the number of submounts 30.

The relay members 40 are formed by using the same material or the same primary material as that for the submounts 30. The relay members 40 may be formed by using a different primary material from that for the submounts 30. In this case, the submounts 30 preferably have a higher thermal conductivity than the relay members 40. It is preferable to consider the heat dissipation properties of the submounts 30 with respect to the heat generated by the light emitting elements 20. On the other hand, the relay members 40 are not equipped with any light emitting element 20, and thus there might be a case in which the thermal conductivity of the relay members can be lower than that of the submounts 30.

The sealing member 70 seals the space in which the light emitting elements 20 are disposed. The light emitting elements 20 can be disposed in a hermetically sealed space. This can suppress the dust from collecting on the light emitting elements 20 to thereby reduce light quality degradation.

The sealing member 70 is disposed on the lateral wall of the base 10. The upper face of the lateral wall and the lower face of the sealing member 70 are bonded together. The frame portion of the sealing member 70 is bonded to the lateral wall. The light reflected by the reflective members 50 transmits through the sealing member 70. The main portion of the light passes through the light transmitting part of the sealing member 70 to exit the sealing member 70. At least 90% of the main portion of the light from the light emitting elements 20 is output from the sealing member 70.

The lens member 80 is positioned above the light emitting elements 20. The lens member 80 is disposed above the sealing member 70. The lens member 80 is bonded to the sealing member 70. The lens member 80 is bonded by using, for example, a UV-curable adhesive. Using a UV-curable adhesive can allow the lens member 80 to be adjusted to a desired mounting position before being bonded.

The lens member 80 is disposed so as to allow the light emitted by the individual light emitting elements 20 to pass through the individual lens faces before exiting the lens member.

Variations of First Embodiment

A light emitting device according to Variations of the First Embodiment will be explained next. In each of the several Variations presented below, the layout of the light emitting elements 20 differs from that of the light emitting device 1 according to the First Embodiment discussed above. Accordingly, there are differences in the way the wirings 60 are connected and the layout of the relay members 40 attributable to the differences in the layout of the light emitting elements 20.

In each Variation of the light emitting device, the base 10, the reflective members 50, the sealing member 70, and the lens member 80 are the same as those in the light emitting device 1 of the First Embodiment. Accordingly, for these constituent elements, the description explained with reference to the light emitting device 1 of the First Embodiment applies.

In each Variation of the light emitting device, the same explanation of each of the constituent elements, such as the light emitting elements 20, the submounts 30, the relay members 40, and the wirings 60, as those provided with reference to the First Embodiment applies.

FIG. 1 is a perspective view of a light emitting device related to each Variation, FIG. 2 is a top view of the light emitting device according to each Variation. In each Variation, the same definitions of inter-row, intra-row, outside-of-row regions as those described with reference to the light emitting device 1 according to the First Embodiment apply.

FIG. 6 to FIG. 9 are drawings related to Variations described below. For each Variation of the light emitting device, the same is true with respect to the description that has been given in reference to the light emitting device 1 of the First Embodiment to the extent that there is no inconsistency in the comparison with the drawings for the Variations.

First Variation

FIG. 6 is a top view illustrating the wiring for electrically connecting the light emitting elements in a light emitting device 1A of a First Variation. In the case of the light emitting device 1A illustrated in the drawing, the first to seventh columns in the second row are the first light emitting elements 20A, the first to third, sixth, and seventh columns in the first row are the second light emitting elements 20B, and the fourth and fifth columns in the first row are the third light emitting elements 20C. The first light emitting element 20A emit blue light, second light emitting elements 20B emit red light, and third light emitting elements 20C emit green light.

In the light emitting device 1A, the second light emitting elements 20B are disposed on both sides of the third light emitting elements 20C so as to interpose the third light emitting elements 20C. With respect to the second light emitting elements 20B disposed on both sides, the peak wavelengths of the light emitted by the second light emitting elements 20B disposed on one side are higher by 3 nm to 10 nm than the peak wavelengths of the light emitted by the second light emitting elements 20B disposed on the other side.

Multiple second light emitting elements 20B are disposed on one side, and multiple second light emitting elements 20B are disposed on the other side. The peak wavelengths of the light emitted by the second light emitting elements 20B disposed on one side are set to be close to each other with a difference of less than 3 nm among them. The peak wavelengths of the light emitted by the second light emitting elements 20B disposed on the other side are set to be close to each other with a difference of less than 3 nm among them.

The second light emitting elements 20B disposed on one side is greater in number, and emit light of a shorter peak wavelength, than the second light emitting elements 20B disposed on the other side. In the case of using red light emitting elements, for example, because the light of a shorter peak wavelength has a higher relative luminous efficiency, providing a larger number of light emitting elements that emit light of a shorter peak wavelength can achieve brighter visual perception.

In the state of being mounted on the submounts 30, the electrodes on the upper faces of the first light emitting elements 20A in the light emitting device 1 and the electrodes on the upper faces of the first light emitting elements 20A in the light emitting device 1A are different. In the light emitting device 1, a wiring 60 is joined with the submount 30 on which, among the first light emitting elements 20A disposed in the row direction, the first light emitting element 20A positioned at one end is mounted, and a first relay member 40A. In the light emitting device 1A, a wiring 60 is joined with the upper face of the first light emitting element 20A positioned at one end among the first light emitting elements 20A disposed in the row direction, and a relay member 40 disposed on the outside of the inter-row region (hereinafter referred to as the fourth relay member 40D). In the light emitting device 1A illustrated in the drawing, the fourth relay member 40D is disposed in the fourth outside-of-row region. By providing a fourth relay member 40D in this manner, the wirings 60 can be joined without being positioned in the optical paths of the light reflected by the reflective members 50.

Second Variation

FIG. 7 is a top view illustrating the wiring for electrically connecting the light emitting elements in a light emitting device 1B of a Second Variation. The layout and the emission colors of the first light emitting elements 20A, the second light emitting elements 20B, and the third light emitting elements 20C of the light emitting device 1B are similar to those in the light emitting device 1.

In the light emitting device 1B, the first light emitting elements 20A include first light emitting element(s) 20A emitting light of a peak wavelength that is a first wavelength, first light emitting element(s) 20A emitting light of a peak wavelength that is a second wavelength, and first light emitting element(s) 20A emitting light of a peak wavelength that is a third wavelength, which will hereinafter simply be referred to as a first light emitting element 20A of the first wavelength, a first light emitting element 20A of the second wavelength, and a first light emitting element 20A of the third wavelength, respectively.

In the light emitting device 1B, the number of the first light emitting elements 20A of the first wavelength is greater than the number of the first light emitting element(s) 20A of the second wavelength. The number of the first light emitting elements 20A of the first wavelength is greater than the number of the first light emitting element(s) 20A of the third wavelength.

The first light emitting elements 20A of the first wavelength include a first light emitting element 20A positioned between a first light emitting element 20A of the second wavelength and a first light emitting element 20A of the third wavelength. The first light emitting elements 20A include a first light emitting element 20A of the second wavelength positioned between two first light emitting elements 20A of the first wavelength. The first light emitting elements 20A include a first light emitting element 20A of the third wavelength positioned between two first light emitting elements 20A of the first wavelength.

In the first light emitting elements 20A disposed in a row, there is a difference in the 3 nm to 10 nm range between the peak wavelengths of the light emitted by two adjacent first light emitting elements 20A. The first light emitting elements 20A are disposed such that no two elements of the same wavelength among the first, second, and third wavelengths, are adjacent with one another.

In the light emitting device 1B illustrated in the drawing, the peak wavelength of the light emitted by a first light emitting element 20A of the first wavelength is 640 nm at most. The peak wavelength of the light emitted by a first light emitting element 20A of the third wavelength is at least 645 nm. The peak wavelength difference between a first light emitting element 20A of the minimum peak wavelength and a first light emitting element 20A of the maximum peak wavelength among the first light emitting elements 20A is 10 nm at most. First light emitting elements 20A of the first wavelength are positioned at both ends and first light emitting elements 20A of the first wavelength are positioned between these both ends of the row. Using the first light emitting element 20A of the first wavelength positioned between these both ends as a reference point, the first light emitting elements 20A of the second wavelength and the first light emitting elements 20A of the third wavelength are symmetrically disposed.

In the light emitting device 1B, the current flows in a reverse direction as compared to the light emitting device 1. In the light emitting device 1, a wiring 60 was joined with the submount 30 on which, among the first light emitting elements 20A disposed in the row direction, the first light emitting element 20A positioned at one end and a first relay member 40A. In the light emitting device 1B, a wiring 60 is joined with the upper face of the first light emitting element 20A at one end among the first light emitting elements 20A disposed in the row direction and a first relay member 40A. This first relay member 40A is positioned between two reflective members 50. This first relay member 40A is disposed in the intra-row region based on the reflective members 50 corresponding to the first light emitting elements 20A. In the light emitting device 1B, the first light emitting element wirings 60A that pass between the two adjacent reflective members 50 among the reflective members 50 corresponding to the first light emitting elements 20A and disposed in the row direction are present. Disposing the first relay member 40A in this manner can reduce the number of relay members 40.

Third Variation

FIG. 8 is a top view illustrating the wiring for electrically connecting the light emitting elements in a light emitting device 1C of a Third Variation. In the case of the light emitting device 1C illustrated in the drawing, the first, fourth, and seventh columns in the second row are the first light emitting elements 20A, the first to seventh columns in the first row are the second light emitting elements 20B, and the second, third, fifth, and sixth columns in the second row are the third light emitting elements 20C. The first light emitting elements 20A emit blue light, second light emitting elements 20B emit red light, and third light emitting elements 20C emit green light.

In the light emitting device 1C, one or more second relay members 40B are disposed in the outside-of-row regions on both sides in the column direction so as to interpose the inter-row regions. The light emitting device 1C has one or more second relay members 40B disposed in the first or second outside-of-row region, and one or more second relay members 40B disposed in the third or fourth outside-of-row region. The light emitting device 1C illustrated in the drawing has multiple second relay members 40B disposed in the second outside-of-row region, and multiple second relay members 40B disposed in the third outside-of-row region.

The light emitting device 1C has first light emitting elements 20A positioned at both ends in the row direction and first light emitting element 20A positioned between these both ends, and the third light emitting elements 20C that interpose the first light emitting element 20A positioned between these both ends. Using the first light emitting element 20A positioned between these both ends as a reference point, the third light emitting elements 20C and the other first light emitting elements 20A are symmetrically disposed.

The wavelength setting and the layout of the second light emitting elements 20B disposed in the row direction in the light emitting device 1C illustrated in the drawing are similar to those of the first light emitting elements 20A in the light emitting device 1 or 1B. In the light emitting device 1C, the second light emitting elements 20B of the first wavelength, the second light emitting elements 20B of the second wavelength, and the second light emitting elements 20B of the third wavelength are disposed in a similar manner to that of the first light emitting elements 20A in the light emitting deice 1B.

In a light emitting device 1C, one or more first light emitting elements 20A are electrically connected to one of the first wirings 161 and one of the second wirings 162, one or more second light emitting elements 20B are electrically connected to both of the second wirings 162, and one or more third light emitting elements 20C are electrically connected to one of the first wirings 161 and one of the second wirings 162.

Fourth Variation

FIG. 9 is a top view illustrating the wiring for electrically connecting the light emitting elements in a light emitting device 1D of a Fourth Variation. In the light emitting device 1D, the first light emitting elements 20A, the second light emitting elements 20B, and the third light emitting elements 20C are disposed in a row. The first light emitting elements 20A, the second light emitting elements 20B, and the third light emitting elements 20C are disposed in both two rows. The light emitting elements 20 are disposed in the first and second rows such that those emitting the same color light are disposed in the same columns.

In the case of the light emitting device 1D illustrated in the drawing, the fifth to the seventh columns in the first and the second rows are the first light emitting elements 20A, the third and the fourth columns in the first and the second rows are the second light emitting elements 20B, and the first and the second columns in the first and the second rows are the third light emitting elements 20C. The first light emitting elements 20A emit red light second light emitting elements 20B emit blue light, and third light emitting elements 20C emit green light.

In the light emitting device 1D, the second relay members 40B are disposed in two rows in the outside-of-row regions. In each of the two rows, one or more second relay members 40B are disposed. Each of the current path through the one or more second relay members 40B disposed in the first row and the current path through the one or more second relay members 40B disposed in the second row electrically connects the light emitting elements 20 that emit different colors from one another.

In the light emitting device 1D, in order to electrically connect the first light emitting elements 20A in the first row and the second row, one or more first relay members 40A are disposed in the inter-row region. In order to electrically connect the second light emitting elements 20B in the first row and the second row, one or more first relay members 40A are disposed in the inter-row region. In order to electrically connect the third light emitting elements 20C in the first row and the second row, one or more first relay members 40A are disposed in the inter-row region.

In the light emitting device 1D, no relay member 40 with which a wiring 60 serving as both the first light emitting element wiring 60A and the second light emitting element wiring 60B is joined is disposed in the first inter-row region. No relay member 40 with which a wiring 60 serving as both the first light emitting element wiring 60A and the third light emitting element wiring 60C is joined is disposed in the first inter-row region. No relay member 40 with which a wiring 60 serving as both the second light emitting element wiring 60B and the third light emitting element wiring 60C is joined is disposed in the first inter-row region.

Second Embodiment

Subsequently, a light emitting device 2 according to a Second Embodiment is described. FIG. 1 to FIG. 3 and FIG. 10 illustrate exemplary aspects according to the Second Embodiment. FIG. 1 is a perspective view of the light emitting element 2. FIG. 2 is a top view of the second light emitting element 2. FIG. 3 is a cross-sectional view taken along a line in FIG. 2. FIG. 10 is a top view illustrating the wirings for electrically connecting a plurality of light emitting element in the light emitting device 2. Also in the Second Embodiment, definitions of the inter-row regions, the intra-row regions, and the outside-of-row regions are the same as those defined for the light emitting device 1.

The light emitting device 2 includes a plurality of constituent elements. The constituent elements include a base 10, a plurality of light emitting elements 20, a plurality of submounts 30, one or more relay members 40, a plurality of reflective members 50, a plurality of wirings 60, a sealing member 70, and a lens member 80. The light emitting device 2 may include other elements besides those described above. Furthermore, the light emitting device 2 does not have to include a certain element among those listed here.

The descriptions for the light emitting device 1 and constituent elements of the First Embodiment given above that has no inconsistency to FIG. 1 to FIG. 3 and FIG. 10 according to the Second Embodiment are similarly applied as the descriptions for the light emitting device 2.

The light emitting device 2 includes a plurality of light emitting elements 20, one or more first light emitting elements 20A, and one or more second light emitting elements 20B. The first light emitting elements 20A and the second light emitting elements 20B are electrically connected so as to be capable of independent driving.

The first light emitting elements 20A and the second light emitting elements 20B emit light of the same color. Each of the first light emitting elements 20A and the second light emitting elements 20B emit light of a color selected from the group consisting of red, green and blue. For example, the first light emitting elements 20A and the second light emitting elements 20B emit light of blue color.

As compared to the case in which all the light emitting elements 20 disposed in a row direction are serially connected, and the light emitting elements 20 disposed in different row(s) are independently driven, for example, a degree of entire light emitted by each driving can be within a region approximate to a square. Such a region may be preferable for an optical control in some cases.

Alternatively, the first light emitting elements 20A and the second light emitting elements 20B can emit light of colors different from each other. Each of the first light emitting elements 20A and the second light emitting elements 20B emit light of a color selected from the group consisting of red, green and blue. For example, the first light emitting elements 20A emit blue light, and the second light emitting elements 20B emit green light.

In the example of the light emitting device 2 shown in the drawings, the first light emitting elements 20A are positioned from the first column to the fifth column in the first row, and from the first column to the fifth column in the second row. Also, the second light emitting elements 20B are positioned from the sixth column and the seventh column in the first row, and from the sixth column and the seventh column in the second row. The first light emitting elements 20A emit blue light and the second light emitting elements 20B emit green light.

With respect to the light emitting elements 20 disposed in rows and columns, both of the first light emitting element(s) 20A and the second light emitting element(s) 20B are disposed in each of adjacent two rows. In each adjacent two rows, the plurality of first light emitting elements 20A and the plurality of second light emitting elements 20B are disposed in the same row.

As the example of the light emitting device 2 shown in FIG. 10, an aspect in which relay members 40 are disposed in intra-row region based on the reflective members 50 disposed in the first row. Also, an aspect in which relay members 40 are disposed in intra-row region based on the reflective members 50 disposed in the second row.

In the light emitting device 2, the first light emitting element wirings 60A are connected to two first wirings 161 among the plurality of wirings 16, and the second light emitting element wirings 162 are connected to the second wirings 162 among the plurality of wirings 16. The first light emitting element wirings 60A are not connected to any one of the second wirings 162, and the second light emitting element wirings 60B are connected to any one of the first wirings 161.

In a top view, a relay member 40 connected to the first light emitting element wiring 60A and the relay member 40 connected to the second light emitting element 60B are disposed in a region between two virtual lines that are parallel to each other in the column direction and respectively passing through the first light emitting element 20A and the second light emitting element 20B (the first light emitting element 20A in the fifth row and the second light emitting element 20B in the sixth row in FIG. 10)

In between these two virtual lines, the relay member 40 connected to the first light emitting element wiring 60A is disposed in the intra-row region, and the relay member 40 connected to the second light emitting element wiring 60B is disposed in the outside-of-row region. In the example of the light emitting device 2 shown in the drawing, the relay member 40 connected to the first light emitting element wiring 60A is disposed in the first intra-row region, and the relay members 40 connected to the second light emitting element wiring 60B are respectively disposed in the first outside-of-row region and the third outside-of-row region.

Except for the third relay member 40C, the relay members 40 connected to the first light emitting element 60A are not disposed in neither a region in which the first outside-of-row region and the second outside-of-row region overlap, nor a region in which the third outside-of-row region and the fourth outside-of-row region overlap. The one or more relay member 40 connected to the second light emitting element wiring 60B but not the third relay member 40C are disposed in the region in which the first outside-of-row region and the second outside-of-row region overlap, and the region in which the third outside-of-row region and the fourth outside-of-row region overlap.

Among the first light emitting element 20A and the second light emitting element 20B adjacent to each other in the row direction, the second light emitting element wiring 60B and the relay member 40 connected to the second light emitting element wiring 60B are not disposed in a region, in which no second light emitting element(s) 20B is disposed, provided by dividing the disposition region into two regions by a virtual line that is parallel to the column direction and passes through the first light emitting elements 20A.

Among the first light emitting element 20A and the second light emitting element 20B adjacent to each other in the row direction, the first light emitting element wiring 60A and the relay member 40 connected to the first light emitting element wiring 60A are not disposed in a region, in which no first light emitting element(s) 20A is disposed, provided by dividing the disposition region into two regions by a virtual line that is parallel to the column direction and passes through the second light emitting elements 20B.

Variations of Second Embodiment

Subsequently, light emitting devices according to Variations of the Second Embodiment will be described. Several Variations will be described below. The light emitting devices in the several Variations are different from the light emitting device 2 according to the Second Embodiment in the arrangement of the plurality of light emitting elements 20. Accordingly, there are some differences in the connection manner of the wirings 60 or the arrangement of the relay members 40 due to the difference of the arrangement of the light emitting elements 20.

The base 10, the reflective members 50, the sealing member 70, and the lens member 80 in the light emitting device in each Variation are the same as those of the light emitting device 2 according to the Second Embodiment. Accordingly, the same descriptions for these constituent elements of the light emitting device 1 according to the First Embodiment are applied as those for Variation.

The descriptions for the constituent elements of the light emitting elements 20, the submounts 30, the relay members 40, and the wirings 60 in the light emitting devices in Variations are the same as or similar to those in the constituent elements in the First Embodiment.

FIG. 1 is a perspective view of the light emitting device in Variations. FIG. 2 is a top view of the light emitting device in Variations. The same definitions of inter-row, intra-row, outside-of-row regions for the light emitting device 1 according to First Embodiment are applied as the definitions for those in Variations.

FIG. 11 and FIG. 12 relate to illustrations of Variations described below. The descriptions for the light emitting device 2 according to the Second Embodiment given above that has no inconsistency to the drawings of Variations is similarly applied as the descriptions for the light emitting devices in Variations.

First Variation

FIG. 11 is a top view illustrating the wirings for electrically connecting the plurality of light emitting elements in the light emitting device 2A according to a First Variation. In the example of the light emitting device 2A shown in the drawings, the first light emitting elements 20A are positioned from the first column to the fourth column in the first row, and from the first column to the fourth column in the second row. Also, the second light emitting elements 20B are positioned from the fifth column to the seventh column in the first row, and from the fifth column to the seventh column in the second row.

As shown in the Second Embodiment and the First Variation, the first light emitting elements 20A can be disposed in one region and the second light emitting elements 20B can be disposed in the other region demarcated from the one region using certain adjacent two columns in plurality of rows as a border. In such a case, the certain two columns can be appropriately selected.

Second Variation

FIG. 12 is a top view illustrating the wirings for electrically connecting the plurality of light emitting elements in the light emitting device 2B according to a Second Variation. In the example of the light emitting device 2B shown in the drawings, the first light emitting elements 20A are positioned from the first column to the third column in the first row, and from the first column to the fourth column in the second row. Also, the second light emitting elements 20B are positioned from the fourth column to the seventh column in the first row, and from the fifth column to the seventh column in the second row.

In the light emitting device 2B, an equal number of the first light emitting elements 20A and the second light emitting elements 20B is disposed in two rows and M columns (M is a natural number not less than 3 and is an odd number). Only in the middle column (the ordinal number as the number of columns obtained by dividing M+1 by 2) in M columns, the first light emitting element 20A is positioned in one row of the two rows and the second light emitting element 20B is positioned in the other row. Either case in which the first light emitting elements 20A are positioned in both of the two columns, or the second light emitting elements 20B are positioned in both of the two columns, is applied to other columns.

The relay member 40 connected to the first light emitting element wiring 60A and the relay member 40 connected to the second light emitting element wiring 60B are positioned between two virtual lines that are parallel to each other and respectively pass through the first light emitting elements 20A positioned in both sides of the middle column. The relay member 40 connected to the first light emitting element wiring 60A is positioned in a region between these two virtual lines in the inter-row region.

Third Embodiment

A light emitting device 3 according to a Third Embodiment is described. FIG. 13 to FIG. 16D are schematic views illustrating exemplary aspects of the light emitting device 3. FIG. 13 is a schematic view of a light emitting element 20 of the light emitting device 3. FIG. 14A and FIG. 14B are top views each illustrating a conventional wiring aspect for the light emitting element 20. FIG. 15A to FIG. 15F are top views each illustrating an example wiring aspect for the light emitting element 20 of the light emitting device 3. FIG. 16A is a graph showing a comparison of temperature characteristics of the optical outputs between the example wirings in FIG. 14A, FIG. 14B, FIG. 15A, and FIG. 15B. FIG. 16B is a graph showing a comparison of temperature characteristics of the forward voltages between the example wirings in FIG. 14A, FIG. 14B, FIG. 15A, and FIG. 15B. FIG. 16C is a graph showing a comparison of the temperature characteristics of the forward voltages between the example wirings in FIG. 15B, FIG. 15C, and FIG. 15D. FIG. 16D is a graph showing a comparison of the temperature characteristics of the forward voltages between the example wirings in FIG. 15A, FIG. 15E, and FIG. 15F.

FIG. 1 to FIG. 9 are applicable as drawings illustrating the light emitting device 3. The description of the light emitting device according to the First Embodiment and Variations also applicable as a description of the light emitting device 3. However, among the illustrations and description for the light emitting devices of the First Embodiment and Variations above, those inconsistent to the illustrations among FIG. 13 to FIG. 16D and description below according to the light emitting device 3 are not applicable as the illustrations and description for the light emitting device 3.

The light emitting device 3 includes a plurality of constituent elements. The constituent elements include a base 10, one or more light emitting elements 20, one or more submounts 30, one or more relay members 40, one or more reflective members 50, a plurality of wirings 60, a sealing member 70, and a lens member 80.

The light emitting device 3 can include other elements besides those described above. The light emitting device 3 does not have to have the same structure as the light emitting device according to the First Embodiment or the Variations. Disclosures of the light emitting device 3 according to the Third Embodiment is applicable without limiting to the light emitting device in which the light emitting elements disposed in a row are electrically connected in separate two groups each independently drivable.

The one or more light emitting elements 20 in the light emitting device 3 include a light emitting element having two or more light-emitting points 21 on the light emitting face. The light emitting elements 20 are, for example, semiconductor laser elements. A first light emitting element 20A in the light emitting device 3 may be such a light emitting element 20 having two or more light-emitting points 21. The light emitting device 3 is described as that the first light emitting element 20A is this light emitting element 20, as a matter of convenience. In place of the first light emitting element 20A, or as the first light emitting element 20A, a second light emitting element 20B or a third light emitting element 20C can have two or more light-emitting points 21 on its light emitting face.

The first light emitting element 20A has two or more waveguides 22 respectively corresponding to the light-emitting points 21. Two or more waveguides 22 extend along a direction perpendicular to the light-emitting face in a top view. Here, the "perpendicular" include a tolerance of ±5°. The waveguides 22 do not have to be extend in the direction perpendicular to the light-emitting face.

FIG. 13 shows the light emitting element 20 having two light-emitting points 21 (i.e., a first light-emitting point 21A and a second light-emitting point 21B). FIG. 13 also shows the light emitting element 20 having a first waveguide 22A corresponding to the first-light emitting point 21A, and a second waveguide 22B corresponding to the second light-emitting point 21B.

FIG. 14A and FIG. 14B show conventional aspects each in which the wirings 60 are connected to the light emitting element 20A having the two light-emitting points 21 and the two waveguides 22. As shown in these figures, the wirings 60 are connected such that the connection positions thereof are located directly above the waveguides 22 on the upper face of the first light emitting element 20A meeting its light-emitting face. The wirings 60 are connected such that number thereof is equivalent directly above each waveguide 22.

It is considered that such a connection aspect is applied to reflect a technical idea that the connection of the wirings 60 symmetrically or equivalent to each waveguides 22 as much as possible may bring an equivalent electric current flow, and therefore unevenness of the optical output and/or unevenness of the electrical load applied to the waveguides 22 would not occur to stably operate the light emitting element.

However, depending on the volume of the current input to the first light emitting element 20, the number of the wirings 60 connected to the first light emitting element 20A is preferably plural, but not one. Such a case corresponds to the aspect in which the wirings 60 are connected in a manner as shown in FIG. 14A or FIG. 14B. According to the technical idea, the number of the wirings 60 connected to the first light emitting element 20A is the integer multiple of the number of the waveguides 22. For example, the number of the wirings 60 is intended to be 2 in relation to the input current, it can be considered that two wirings 60 are provided for each waveguide 22 in consideration of the electrical load to the waveguides 22.

FIG. 15A to FIG. 15F show example connection aspects of the wirings 60 that are not based on such a conventional aspect or technical idea. The connection aspects exemplary shown here can be applied to the light emitting device 3 in which two to five wirings 60 are connected to the upper face of one first light emitting element 20A. Without limiting thereto, these aspects can be applicable to the light emitting device 3 in which six or more wirings 60 are connected to the upper face of one first light emitting element 20A.

A plurality of the wirings 60 are connected to the upper face of the first light emitting element 20A in the light emitting device 3. First light emitting element wirings 60A include a plurality of wirings 60 connected to the upper face of the first light emitting element 20A. The wirings 60 connected to the upper face of one first light emitting element 20A described here can be limited to applicable wirings 60 of which one end is connected to the upper face of the first light emitting element 20A and the other end is connected to the common constituent elements except for the first light emitting element 20A. In other words, among the wirings 60, one(s) connected to constituent element(s) different from the common constituent element at the other end can be excluded. For example, in the case in which the wirings 60 connected to the upper face of the first light emitting element 20A include the wirings 60 connected to the submount 30 at the other end, and include the wiring(s) 60 connected to Zener diode at the other end, the latter can be excluded from the applicable wirings 60.

As shown in FIG. 15A to FIG. 15F, the number of the wirings 60 connected to the upper face of the first light emitting element 20A is two or more. As shown in FIG. 15B to 15D, the number of the wirings 60 connected to the upper face of the first light emitting element 20A is three or more. Accordingly, the number of the wirings 60 connected to the upper face of the first light emitting element 20A can be even number or odd number. In other words, odd number of the wirings 60 can be connected to the light emitting element 20 having two waveguides 22.

In the light emitting device 3, in the upper face of the first light emitting element 20A, (i) the number of the wirings 60 whose connection position(s) is located in a region overlapping the first waveguide 22A, and (ii) the number of the wirings 60 whose connection position(s) is located in a region overlapping the second waveguide 22B, are both zero. Alternatively, in the case in which at least one of (i) and (ii) is one or more, (i) and (ii) are not the same number. FIG. 15A, FIG. 15B, FIG. 15E, and FIG. 15F show examples of the former (i.e., both (i) and (ii) are zero), and FIG. 15C and FIG. 15D show examples of the latter (i.e., at least one of (i) and (ii) is one or more and is not the same number). The connection position refers to the center point of the connection shape of the wiring 60 connected to the upper face.

In regard to the wirings 60 connected to the upper face of the first light emitting element 20A, the connection position(s) of the wirings 60 and the upper face of the first light emitting element 20A is located between (iii) a virtual line passing through the point on the first waveguide 22A closest to the second waveguide 22B and being perpendicular to the light-emitting face (hereinafter also referred to as first virtual line) and (iv) a virtual line passing through the point on the second waveguide 22B closest to the first waveguide 22A and being perpendicular to the light-emitting face (hereinafter also referred to as second virtual line). "A region between the first virtual line and the second virtual line" does not include a line on the first virtual line and a line on the second virtual line. FIG. 15A, FIG. 15B, FIG. 15E, and FIG. 15F show the examples of these. Setting the connection position(s) of the wirings 60 in this region can make the connection more stable than in the case in which the wirings 60 is connected on the edge(s) of the upper face of the first light emitting element 20A.

In regard to the wirings 60 connected to the upper face of the first light emitting element 20A, the connection position(s) of the wirings 60 and the upper face of the first light emitting element 20A is located in a region including the second waveguide 22B using the first virtual line as a boarder in a top view, or a region including the first waveguide 22A using the second virtual line as a boarder in a top view. As the identification of these regions, the line in the first virtual line and the line in the second virtual line are not included in these regions. FIG. 15D shows the former example, and FIG. 15C shows the latter example.

In regard to the wirings 60 connected to the upper face of the first light emitting element 20A, in the upper face of the first light emitting element 20A connected to the wirings 60, no wiring 60 is provided whose connection position is located in a region that does not include the second waveguide 22B in a top view assuming that the upper face of the first light emitting element 20A is divided into two regions using the first virtual line as the boarder, and no wiring 60 is provided whose connection position is located in a region that does not include the first waveguide 22A in a top view assuming that the upper face of the first light emitting element 20A is divided into two regions using the second virtual line as the boarder. As the identification of these regions, the line on the first virtual line and the line on the second virtual line are not included in these regions. FIG. 15A, FIG. 15B, FIG. 15E, and FIG. 15F show example of these.

In regard to the wirings 60 connected to the upper face of the first light emitting element 20A, a region including the first waveguide 22A and a region including the second waveguide 22B are defined assuming that the upper face of the first light emitting element 20A is divided into two regions using a virtual line that is a median line of the first virtual line and the second virtual line (hereinafter also referred to as third virtual line). The number (v) of the wirings whose connection position(s) is located in a region including the first waveguide 22A and the number (vi) of the wirings whose connection position(s) is located in a region including the second waveguide 22B are both zero. Alternatively, in the case in which at least one of (v) and (vi) is one or more, (v) and (vi) are not the same number. As the identification of these regions, the line on the third virtual line is not included in these regions.

On the upper face of the first light emitting element 20A and in a direction perpendicular to the light-emitting face, a distance between a wiring 60 closest to the light-emitting face and a wiring 60 farthest from the light-emitting face is greater than an absolute value of a distance difference between a distance from the light-emitting face to the wiring 60 closest to the light-emitting face and a distance from a face positioned opposite to the light-emitting face to the wiring 60 farthest from the light-emitting face. This example is shown in all figures among FIG. 15A to FIG. 15F except for FIG. 15E.

In the direction perpendicular to the light-emitting face, the distance between and the plurality of wirings 60 connected to the upper face of the first light emitting element 20A is 200 μm to 500 μm. The number of the wirings 60 connected to the upper face of the first light emitting element 20A is a value obtained by dividing a length in the direction perpendicular to the light-emitting face of the first light emitting element 20A by 500 μm (figures below a decimal point is omitted) or more, and a value obtained by dividing the length in the direction perpendicular to the light-emitting face of the first light emitting element 20A by 200 μm (figures below a decimal point is omitted) or less.

Consideration of test results shown in FIG. 16A to FIG. 16D are given below. In the tests of FIG. 16A to FIG. 16D, a semiconductor laser element emitting laser light having a peak wavelength of 643 nm as the first light emitting element 20A. For connection aspects of the wirings 60 shown in FIG. 15A to FIG. 15F, five first light emitting element 20A are provided, and averages of measured values of these five elements are plotted as the measurement results in FIG. 16A to FIG. 16D. Temperature characteristics are measured at 25° C., 45° C., and 60° C. The temperatures are obtained by operating the semiconductor laser elements sealed in the packages and measuring the temperatures of the packages.

As show in FIG. 16A, even when the number of the wirings 60 connected to the upper face of the first light emitting element 20A is changed, there is no significant difference in the temperature characteristics of optical output [W]. Also, there is no significant difference as compared to the conventional connection aspect such that the number of the wrings for each waveguide 22 corresponds to each other. In other words, it can be said that there is no significant on the temperature characteristics of optical output Po[W] even when employing a connection aspect other than the conventional connection aspect.

As shown in FIG. 16B, the forward voltage Vf[V] tends to be high as less number of the wiring 60 connected to the upper face of the first light emitting element 20A. However, there is no significant difference in the change rate of Vf to the temperature change (inclination of each line in FIG. 16B). Reducing the number of the wirings 60 can achieve not only lowering the manufacturing cost but also shortening the manufacturing time, to thereby improving the productivity. The number of the wirings 60 connected to the upper face of the first light emitting element 20A is preferably three to five from a viewpoint of taking a balance of relationship with Vf elevation.

As shown in FIG. 16C, assuming the direction perpendicular to the light-emitting face in a top view, even when the same number of wirings 60 are disposed in the center region, right side or left side from the center region of the upper face, there is no significant difference between these arrangements. Whether any bias is found in broken emitters in FIG. 15B to FIG. 15D or not was confirmed by increasing input temperature, any bias or regularity was not found between the arrangements in the center region, right side or left side of from the center region of the upper face. In other words, even when the wirings 60 are disposed in either side from the center region of the upper face, there is no significant difference between input current flowing through the waveguide 22 closer to these wirings 60 and input current flowing through the waveguide 22 farther from these wirings 60.

As shown in FIG. 16D, Vf value is low when the wirings 60 are connected as shown in FIG. 15A or FIG. 15F as compared to the case shown in FIG. 15E, even when the same number of wirings 60 are connected. FIG. 15E is different from FIG. 15A and FIG. 15F in that the wirings 60 are connected at the position closer to the light-emitting face with narrower intervals. In comparison between FIG. 15A in which the wirings 60 are connected at the position closer to the light-emitting face with wider interval and FIG. 15F in which the wirings 60 are connected at a position farther from the light-emitting face with the narrower intervals, a relation such as a distance from the light-emitting face, a distance between the plurality of wirings 60, and a distance between the light-emitting face and the face opposite thereto is considered to effect on the temperature characteristics for Vf.

The light emitting device 3 shown in the drawings are illustrated as light emitting devices 20 each having two waveguides 22, however, connection aspects of the wirings 60 described in the Second Embodiment can also be applied to a light emitting device 20 having three or more waveguides 22.

In the upper face of the first light emitting element 20A having two or more waveguides 22, in a top view, the number of the wirings 60 whose connection position(s) is located in a region overlapping the waveguide 22 is zero in each waveguide 22. Alternatively, in the case in which the number of the wirings 60 whose connection position is located in a region overlapping the waveguide 22 is one or more in at least one of the waveguide 22, the number of the wirings is not the same.

For example, the connection position(s) of the wirings 60 connected on the upper face of the light emitting element 20 having two or more waveguides 22 is positioned in a middle region of trisection of the upper face divided by virtual lines parallel to a direction extending along the waveguides 22 in a top view. In addition, the number of the wirings 60 whose connection position(s) is positioned at both sides of the trisection of the upper face is zero. Alternatively, the number of the wirings 60 whose connection position(s) is positioned in at least one of both sides of the middle region in the trisection of the upper face is not the same.

In a viewpoint of not based on the conventional connection aspects, the number of the wirings 60 connected on the upper face of the light emitting element 20 having two or more waveguides 22 can be less than twice of the number of the waveguides 22. In this case, a diameter (Φ diameter) of the wirings 60 can be 50 µm or more and 100 µm or less. The greater the diameter of the wiring 60 is, the more the input current to flow therethrough stably, therefore, the diameter is 50 µm or more. The diameter of the wiring 60 is preferably less than 100 µm or less to suppress that the connection shape of the wiring 60 on the upper face of the light emitting element 20 become excessively large.

In the light emitting element 20 having two or more waveguides 22, a thickness of the electrode connected to the wiring 60 is 0.1 µm or more and 10 µm or less. The thickness of the electrode is preferably 0.3 µm or more and 0.5 µm or less. Ensuring sufficient electrode thickness can make the current to easily expand. For example, in a relation with the strength of the substrate, a semiconductor laser element containing GaAs-based semiconductor may have a thickness greater than a thickness of a semiconductor laser element containing GaN-based semiconductor. In the case in which the light emitting element 20 having two or more waveguides 22 is the GaAs-based semiconductor laser element, it can be said that the wiring connection aspects such as the present embodiment suite for it.

In the foregoing, certain embodiments of the present invention have been explained. The present invention, however, is not strictly limited to the embodiments and Variations disclosed. In other words, the present invention is implementable without limiting the outer shape or the structure of a light emitting device to any of those disclosed by the embodiments and Variations. Furthermore, it is not essential for the applicability of the present invention to include all of the constituent elements necessarily and fully. For example, in the event that a certain constituent element of a light emitting device disclosed by any of the embodiments is not disclosed in the claim scope, we claim the applicability of the invention disclosed in the claim scope by recognizing the design flexibility for a person of ordinary skill in the art for such a constituent element through the use of an alternative, an omission, a shape change, a change in the materials employed, or the like.

The light emitting device disclosed in any of the embodiments can be used in projectors, automotive headlights, head-mounted displays, lighting fixtures, displays, and the like.

What is claimed is:

1. A light emitting device comprising:
a base having a mounting face including a disposition region, the base comprising:
a plurality of first wirings disposed apart from the disposition region in a first direction; and
a plurality of second wirings disposed apart from the disposition region in a second direction that is opposite the first direction;
a plurality of light emitting elements, including one or more first light emitting elements, one or more second light emitting elements, and one or more third light emitting elements, the light emitting elements disposed in two rows and N columns (N≥2) in the disposition region, each having a light emitting point above the mounting face;
one or more relay members, including one or more first relay members disposed in a region between the two rows of the light emitting elements in the disposition region;
a plurality of first light emitting element wirings for electrically serially connecting the one or more first light emitting elements to two wirings among the plurality of first wirings and the plurality of second wirings;
a plurality of second light emitting element wirings for electrically serially connecting the one or more second light emitting elements to two wirings among the plurality of first wirings and the plurality of second wirings;
and a plurality of third light emitting element wirings for electrically serially connecting the one or more third light emitting elements to two wirings among the plurality of first wirings and the plurality of second wirings, wherein:
at least one of the two wirings to which the plurality of first light emitting element wirings electrically serially connect the one or more first light emitting elements is not joined with any of the second light emitting element wirings and is not joined with any of the third light emitting element wirings,
at least one of the two wirings to which the plurality of second light emitting element wirings electrically serially connect the one or more second light emitting elements is not joined with any of the first light emitting element wirings and is not joined with any of the third light emitting element wirings,
at least one of the two wirings to which the plurality of third light emitting element wirings electrically serially connect the one or more third light emitting elements is not joined with any of the first light emitting element wirings and is not joined with any of the second light emitting element wirings,
the plurality of first light emitting element wirings include wirings that are connected to the one or more first relay members,
the one or more first light emitting elements are configured to be driven independently from the one or more second light emitting elements,
the one or more first light emitting elements are configured to be driven independently from the one or more third light emitting elements, and
the one or more second light emitting elements are configured to be driven independently from the one or more third light emitting elements.

2. The light emitting device according to claim 1, wherein the plurality of first wirings includes exactly two wirings, and the plurality of second wirings includes exactly two wirings.

3. The light emitting device according to claim 1, wherein the one or more first light emitting elements, the one or more second light emitting elements, and the one or more third light emitting elements emit different color light from one another.

4. The light emitting device according to claim 3, wherein the one or more first light emitting elements, the one or more second light emitting elements, and the one or more third light emitting elements emit different color light from one another selected from red light, green light, and blue light.

5. The light emitting device according to claim 1, wherein one wiring among the plurality of first wirings and the plurality of second wirings is joined with the plurality of first light emitting element wirings, the plurality of second light emitting element wirings, and the plurality of third light emitting element wirings.

6. The light emitting device according to claim 5, wherein:
at least one of the relay members is joined with one of the first light emitting element wirings and one of the second light emitting element wirings, and
at least one of the light emitting element wirings serves as both one of the first light emitting element wirings and one of the second light emitting element wirings.

7. The light emitting device according to claim 5, wherein:
at least one of the first relay members is joined with one of the first light emitting element wirings and one of the third light emitting element wirings, and
at least one of the light emitting element wirings serves as both one of the first light emitting element wirings and one of the third light emitting element wirings.

8. The light emitting device according to claim 5, wherein:
a current path for electrically connecting the plurality of first light emitting elements to the respective two wirings comprises:
a first region for electrically connecting only the first light emitting elements,
a second region for electrically connecting only the first light emitting elements and the third light emitting elements, and
a third region for electrically connecting the first light emitting elements, the second light emitting elements, and the third light emitting elements.

9. The light emitting device according to claim 1, wherein at least one of the first light emitting elements, at least one of the second light emitting elements, and at least one of the third light emitting elements are disposed in one of the two rows.

* * * * *